(12) United States Patent
Lu

(10) Patent No.: US 11,676,893 B2
(45) Date of Patent: Jun. 13, 2023

(54) SEMICONDUCTOR DEVICE AND FABRICATION METHOD FOR THE SAME

(71) Applicant: NANYA TECHNOLOGY CORPORATION, New Taipei (TW)

(72) Inventor: Li-Han Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/511,145

(22) Filed: Oct. 26, 2021

(65) Prior Publication Data

US 2022/0045000 A1 Feb. 10, 2022

Related U.S. Application Data

(62) Division of application No. 16/440,376, filed on Jun. 13, 2019, now Pat. No. 11,456,247.

(51) Int. Cl.
| | | |
|---|---|---|
| *H01L 23/522* | (2006.01) | |
| *H01L 23/528* | (2006.01) | |
| *H01L 21/311* | (2006.01) | |
| *H01L 21/768* | (2006.01) | |

(52) U.S. Cl.
CPC .... *H01L 23/5226* (2013.01); *H01L 21/31116* (2013.01); *H01L 21/76802* (2013.01); *H01L 21/76832* (2013.01); *H01L 23/5283* (2013.01)

(58) Field of Classification Search
CPC ........................ H01L 23/5226; H01L 23/5283
See application file for complete search history.

(56) References Cited

U.S. PATENT DOCUMENTS

| | | | | |
|---|---|---|---|---|
| 7,170,144 B2* | 1/2007 | Hsu | ........................ | G11C 5/005 |
| | | | | 257/499 |
| 8,587,089 B2* | 11/2013 | Chiu | ....................... | H01L 23/10 |
| | | | | 438/106 |
| 8,686,532 B2* | 4/2014 | Nakashiba | ............ | H01L 27/092 |
| | | | | 257/495 |
| 9,082,781 B2* | 7/2015 | Filippi | ................... | H01L 23/564 |
| 9,299,697 B2* | 3/2016 | West | ........................ | H01L 29/78 |
| 10,515,908 B2* | 12/2019 | Teng | ....................... | H01L 24/80 |
| 10,665,607 B1* | 5/2020 | Sugiura | ............... | H01L 23/5226 |

(Continued)

FOREIGN PATENT DOCUMENTS

| | | |
|---|---|---|
| CN | 101770992 A | 7/2010 |
| CN | 101950743 A | 1/2011 |

(Continued)

OTHER PUBLICATIONS

Office Action dated Apr. 13, 2022 related to Chinese Application No. 202010155807.8.

(Continued)

*Primary Examiner* — Eugene Lee
(74) *Attorney, Agent, or Firm* — Xuan Zhang

(57) ABSTRACT

A reliable semiconductor device and a method for preparing the reliable semiconductor device are provided. The semiconductor device includes at least one die comprising an integrated circuit region; a first recess region surrounding the integrated circuit region; and a second recess region surrounding the first recess region. A first columnar blocking structure is disposed in the first recess region and a second columnar blocking structure is disposed in the second recess region.

10 Claims, 33 Drawing Sheets

(56) References Cited

U.S. PATENT DOCUMENTS

| | | | |
|---|---|---|---|
| 10,692,786 B1* | 6/2020 | Lin | H01L 23/055 |
| 11,201,124 B2 | 12/2021 | Liu et al. | |
| 2002/0125577 A1* | 9/2002 | Komada | H01L 23/564 |
| | | | 257/E21.582 |
| 2004/0084777 A1* | 5/2004 | Yamanoue | H01L 24/05 |
| | | | 257/E21.244 |
| 2004/0150070 A1* | 8/2004 | Okada | H01L 22/32 |
| | | | 257/E23.161 |
| 2006/0012012 A1* | 1/2006 | Wang | H01L 23/562 |
| | | | 257/E23.194 |
| 2008/0061397 A1* | 3/2008 | Uchida | H01L 23/585 |
| | | | 257/508 |
| 2009/0134500 A1* | 5/2009 | Kuo | H01L 23/66 |
| | | | 257/659 |
| 2009/0294897 A1 | 12/2009 | Lee et al. | |
| 2010/0078769 A1* | 4/2010 | West | H01L 23/562 |
| | | | 257/E23.179 |
| 2011/0006389 A1 | 1/2011 | Bachman et al. | |
| 2011/0193197 A1* | 8/2011 | Farooq | H01L 21/76898 |
| | | | 257/E21.705 |
| 2011/0260260 A1* | 10/2011 | Nakas | H01L 27/092 |
| | | | 257/369 |
| 2012/0038028 A1 | 2/2012 | Yaung et al. | |
| 2012/0241981 A1* | 9/2012 | Hirano | H01L 23/562 |
| | | | 257/777 |
| 2013/0043566 A1* | 2/2013 | Nakano | H01L 23/585 |
| | | | 257/E23.179 |
| 2014/0264931 A1 | 9/2014 | Wang et al. | |
| 2015/0194455 A1* | 7/2015 | Ho | H01L 21/76898 |
| | | | 438/109 |
| 2017/0141052 A1* | 5/2017 | Pan | H01L 23/564 |
| 2017/0186732 A1* | 6/2017 | Chu | H01L 24/82 |
| 2018/0166401 A1* | 6/2018 | Tomita | H01L 23/5226 |
| 2018/0315723 A1* | 11/2018 | Singh | G06F 30/398 |
| 2019/0164911 A1 | 5/2019 | Pan et al. | |
| 2020/0243516 A1* | 7/2020 | Thei | H01L 24/89 |
| 2020/0303301 A1* | 9/2020 | Chen | H01L 25/50 |

FOREIGN PATENT DOCUMENTS

| | | |
|---|---|---|
| CN | 104810351 A | 7/2015 |
| CN | 106711140 A | 5/2017 |
| TW | 200949998 A | 12/2009 |
| TW | 201724361 A | 7/2017 |
| TW | 201737447 A | 10/2017 |
| TW | 201739000 A | 11/2017 |

OTHER PUBLICATIONS

Office Action dated Feb. 23, 2022 related to U.S. Appl. No. 16/440,376 wherein this application is a DIV of U.S. Appl. No. 16/440,376.

Office Action dated Jul. 11, 2022 related to Chinese Application No. 202010155807.8.

Summary translation of Office Action dated Jul. 11, 2022 related to Chinese Application No. 202010155807.8.

* cited by examiner

SEMICONDUCTOR DEVICE AND FABRICATION METHOD FOR THE SAME

CROSS-REFERENCE TO RELATED APPLICATION

This application is a divisional application of U.S. Non-Provisional application Ser. No. 16/440,376 filed Jun. 13, 2019, which is incorporated herein by reference in its entirety.

TECHNICAL FIELD

The present disclosure relates to a semiconductor device and a fabrication method for the semiconductor device, and more particularly, to a semiconductor device with recesses and a fabrication method for the semiconductor device with recesses.

DISCUSSION OF THE BACKGROUND

Semiconductor devices are used in a variety of electronic applications, such as personal computers, cellular telephones, digital cameras, and other electronic equipment. During the fabrication of the semiconductor devices, cracks or moisture may affect the functionality of the semiconductor devices. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In the present disclosure, a reliable semiconductor device and fabrication method of the semiconductor device are provided.

One aspect of the present disclosure provides a semiconductor device including at least one die. The at least one die includes an integrated circuit region, a first recess region surrounding the integrated circuit region, and a second recess region surrounding the first recess region. A first recess is disposed in the first recess region and a second recess is disposed in the second recess region.

In some embodiments, the semiconductor device further comprises a first conductive structure, wherein the first conductive structure is disposed between the first recess and the second recess.

In some embodiments, the semiconductor device further comprises a second conductive structure, wherein the second conductive structure surrounds the second recess.

In some embodiments, the semiconductor device further comprises a buffer region, wherein the buffer region surrounds the integrated circuit region at a position the buffer region is interposed between the integrated circuit region and the first recess region.

In some embodiments, the first conductive structure comprises a plurality of insulating layers and a plurality of conductive layers, wherein the plurality of insulating layers are stacked on a substrate of the die and the plurality of conductive layers are disposed among some of the plurality of insulating layers.

In some embodiments, the second conductive structure comprises a plurality of insulating layers and a plurality of conductive layers, wherein the plurality of insulating layers are stacked on a substrate of the die and the plurality of conductive layers are disposed among some of the plurality of insulating layers.

In some embodiments, the first conductive structure comprises a plurality of insulating layers, a plurality of conductive layers, and a plurality of vias, wherein the plurality of insulating layers are stacked on a substrate of the die, the plurality of conductive layers are disposed among some of the plurality of insulating layers, and the plurality of vias pass through the other of the plurality of insulating layers to electrically connect to the plurality of conductive layers.

In some embodiments, the second conductive structure comprises a plurality of insulating layers, a plurality of conductive layers, and a plurality of vias, wherein the plurality of insulating layers are stacked on a substrate of the die, the plurality of conductive layers are disposed among some of the plurality of insulating layers, and the plurality of vias pass through the other of the plurality of insulating layers to electrically connect to the plurality of conductive layers.

In some embodiments, the first conductive structure is electrically grounded.

In some embodiments, the second conductive structure is electrically grounded.

Another aspect of the present disclosure provides a semiconductor device including at least one die. The at least one die includes an integrated circuit region, a first recess region surrounding the integrated circuit region, and a second recess region surrounding the first recess region. A first columnar blocking structure is disposed in the first recess region and a second columnar blocking structure is disposed in the second recess region.

In some embodiments, the semiconductor device further comprises a first conductive structure, wherein the first conductive structure is disposed between the first columnar blocking structure and the second columnar blocking structure.

In some embodiments, the semiconductor device further comprises a second conductive structure, wherein the second conductive structure surrounds the second columnar blocking structure.

In some embodiments, the semiconductor device further comprises a buffer region, wherein the buffer region surrounds the integrated circuit region at a position the buffer region is interposed between the integrated circuit region and the first recess region.

In some embodiments, the first conductive structure comprises a plurality of insulating layers and a plurality of conductive layers, wherein the plurality of insulating layers are stacked on a substrate of the die and the plurality of conductive layers are disposed among some of the plurality of insulating layers.

In some embodiments, the second conductive structure comprises a plurality of insulating layers and a plurality of conductive layers, wherein the plurality of insulating layers are stacked on a substrate of the die and the plurality of conductive layers are disposed among some of the plurality of insulating layers.

In some embodiments, the first conductive structure comprises a plurality of insulating layers, a plurality of conductive layers, and a plurality of vias, wherein the plurality of insulating layers are stacked on a substrate of the die, the plurality of conductive layers are disposed among some of the plurality of insulating layers, and the plurality of vias pass through the other of the plurality of insulating layers to electrically connect to the plurality of conductive layers.

In some embodiments, the second conductive structure comprises a plurality of insulating layers, a plurality of conductive layers, and a plurality of vias, wherein the plurality of insulating layers are stacked on a substrate of the die, the plurality of conductive layers are disposed among some of the plurality of insulating layers, and the plurality of vias pass through the other of the plurality of insulating layers to electrically connect to the plurality of conductive layers.

In some embodiments, the first conductive structure is electrically grounded.

Another aspect of the present disclosure provides a method for fabrication of a semiconductor device. The method includes providing a substrate having functional circuits formed therein; forming a plurality of insulating layers, wherein the plurality of insulating layers are stacked on the substrate; forming a plurality of conductive layers and a plurality of vias, wherein the plurality of conductive layers are disposed among some of the plurality of insulating layers, and the plurality of vias pass through the other of the plurality of insulating layers to electrically connect to the plurality of conductive layers; and forming a first recess and a second recess, wherein the first recess extends through the plurality of insulating layers and surrounds the functional circuits, and the second recess extends through the plurality of insulating layers and surrounds the first recess.

Due to the design of the semiconductor device, a crack propagating toward the functional circuits may be stopped; the stress of the crack, especially lateral stress, may be reduced; and contaminants may be prevented from entering the functional circuits; thus, a reliable semiconductor device and a method for fabrication of the semiconductor device are provided.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
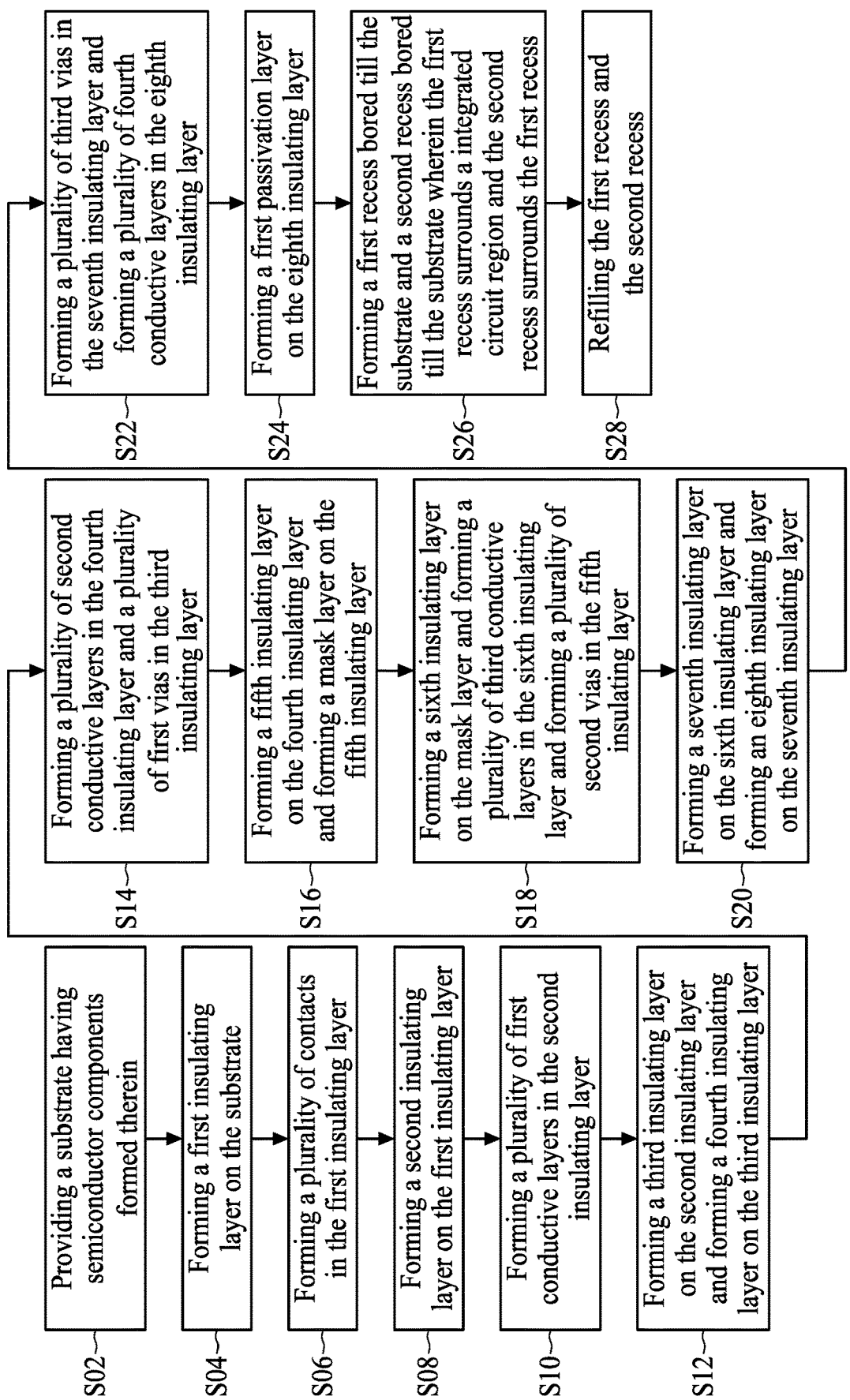
FIG. 1 illustrates, in flowchart diagram form, a method for fabricating a semiconductor device in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

In the semiconductor processes, a plurality of dies, each of which contains an integrated circuit, are simultaneously fabricated on a semiconductor wafer. Scribe lines are provided between every two adjacent dies so that the dies can be separated by cutting the semiconductor wafer along the scribe lines. During the die cutting process, a crack may propagate toward the center of the die where all the functional circuits are disposed, thus raising a reliability issue of the functional circuits.

In the present disclosure, a reliable semiconductor device and fabrication method for the semiconductor device are depicted.

Figure 2:
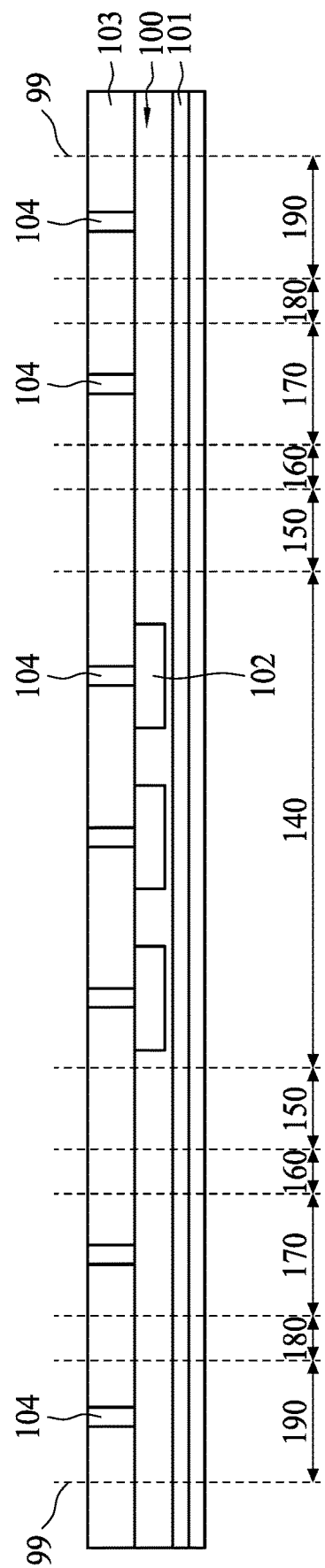
FIG. 2, FIG. 4, FIG. 6, FIG. 9 to FIG. 12, and FIG. 15 illustrate, in schematic cross-sectional diagrams, a flow of fabricating a semiconductor device in accordance with an embodiment of the present disclosure.

With reference to FIG. 1 and FIG. 2, at step S02, a portion of a semiconductor wafer is provided. In the embodiment depicted, the portion of the semiconductor wafer is within a scribe line boundary 99, wherein a die is to be fabricated on the semiconductor wafer. The portion of the semiconductor wafer is divided into an integrated circuit region 140, a buffer region 150, a first recess region 160, a first seal region 170, a second recess region 180, and a second seal region 190. The integrated circuit region 140 defines a semiconductor wafer surface area where semiconductor components are formed in a substrate and are coupled together to form functional circuits. The buffer region 150 defines a semiconductor wafer surface area that surrounds the integrated circuit region 140 and is between the integrated circuit region 140 and the first recess region 160. A width of the buffer region 150 may be greater than 3 µm. The buffer region 150 may serve as a cushion to prevent defects that may otherwise occur during or after various semiconductor processes and that affect the structure or functionality of the functional circuits in the integrated circuit region 140. The first recess region 160 defines a semiconductor wafer surface area that surrounds the buffer region 150; a recess is to be formed in the first recess region 160 in accordance with a predetermined design. The first seal region 170 defines a semiconductor wafer surface area that surrounds the first recess region 160 and is between the first recess region 160 and the second recess region 180. The second recess region 180 defines a semiconductor wafer surface area that surrounds the first seal region 170; a recess is to be formed in the second recess region 180 in accordance with a predetermined design. The second seal region 190 defines a semiconductor wafer surface area that surrounds the second recess region 180 and is adjacent to the scribe line boundary 99.

With reference to FIG. 1 and FIG. 2, the die includes a substrate 100. The substrate is formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide or any other IV-IV, III-V or II-VI semiconductor material. In the embodiment depicted, the substrate 100 is formed of silicon on insulator, which is p-type silicon with an insulating film 101 therein. The insulating film 101 is formed of, for example, silicon oxide or the like. A plurality of semiconductor components 102 are formed in the substrate 100 in the integrated circuit region 140. The semiconductor components 102 are formed above the insulating film 101. For illustrative purposes, only three semiconductor components 102 are shown, but the disclosure is not limited thereto.

Figure 3:
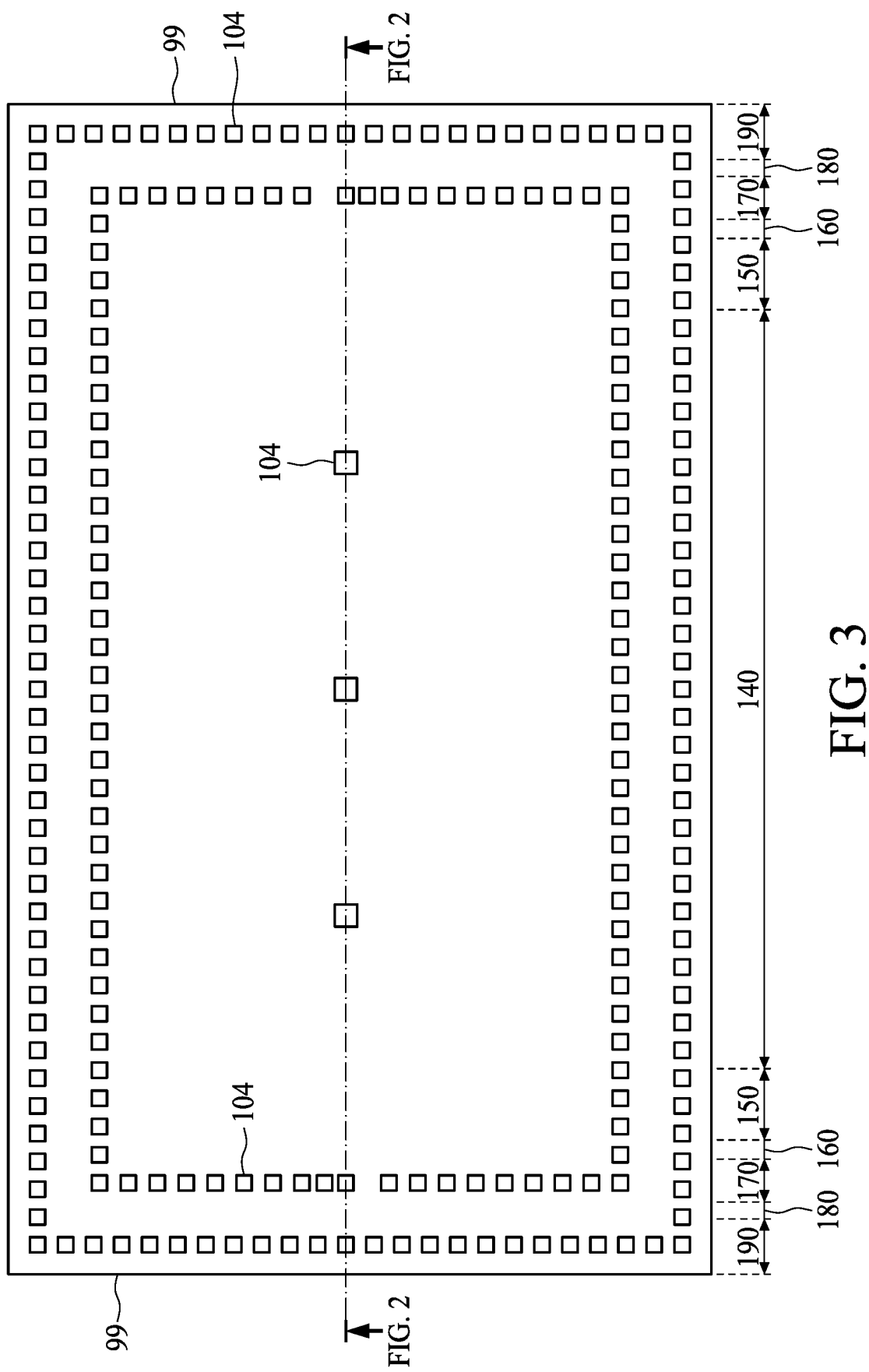
FIG. 3 illustrates, in a schematic top-view diagram, a semiconductor device in accordance with the embodiment shown in FIG. 2.

With reference to FIG. 1, FIG. 2, and FIG. 3, at step S04, a first insulating layer 103 is formed on the substrate 100. The first insulating layer 103 is formed of, for example, silicon oxide, undoped silicate glass, phosphosilicate glass, borosilicate glass, borophosphosilicate glass, fluorinated silicate glass, or the like. In the embodiment depicted, the first insulating layer 103 is formed of undoped silicate glass by chemical vapor deposition or the like. Subsequently, at step S06, a plurality of contacts 104 are formed in the first insulating layer 103. A first photolithography process may be used to pattern the first insulating layer 103 to define positions of the plurality of contacts 104. A first etch process, such as an anisotropic dry etch process, may be performed after the first photolithography process to form a plurality of contact openings in the first insulating layer 103. After the first etch process, a conductive material, for example, aluminum, copper, tungsten, cobalt, or other suitable metal or metal alloy, is filled by a first metallization process, such as chemical vapor deposition, physical vapor deposition, sputtering, or the like, into the plurality of contact openings to form the plurality of contacts 104. A first planarization process, such as chemical mechanical polishing, may be performed after the first metallization process to remove excess filling material and provide a substantially flat surface for subsequent processing steps. Additionally, a plurality of barrier layers (not shown) may be respectively formed on sidewalls and bottoms of the plurality of contact openings prior to the first metallization process. The plurality of barrier layers may be formed of titanium, titanium nitride, titanium-tungsten alloy, tantalum, tantalum nitride, or a combination thereof and may be formed by physical vapor deposition, sputtering, or the like. The plurality of barrier layers may prevent materials deposited during the first metallization process from leaching into the first insulating layer 103 and the substrate 100.

With reference to FIG. 1, FIG. 2, and FIG. 3, the plurality of contacts 104 are formed in the integrated circuit region 140, the first seal region 170, and the second seal region 190. From a top view, the plurality of contacts 104 formed in the first seal region 170 are positioned adjacent to a perimeter of the first recess region 160 and surround the first recess region 160. The plurality of contacts 104 formed in the second seal region 190 are positioned adjacent to a perimeter of the second recess region 180 and surround the second recess region 180. From a cross-sectional view, the plurality of contacts 104 formed in the integrated circuit region 140 respectively electrically couple to the semiconductor components 102. The plurality of contacts 104 formed in the first seal region 170 and the second seal region 190 respectively electrically connect to highly-doped active regions (not shown) in the substrate 100 to be electrically grounded. Alternatively, in another embodiment depicted, the plurality of contacts 104 are only formed in the integrated circuit region 140.

Figure 4:
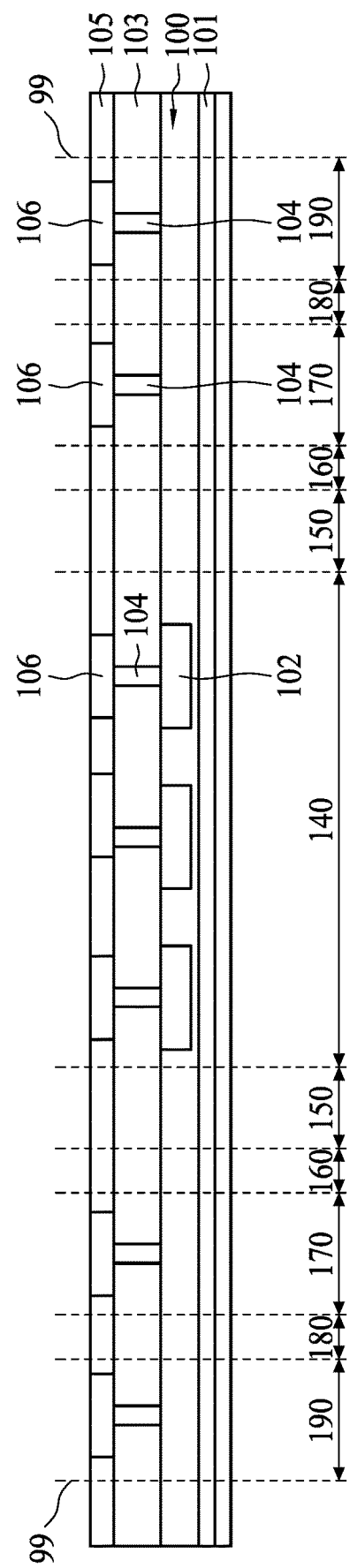
Figure 5:
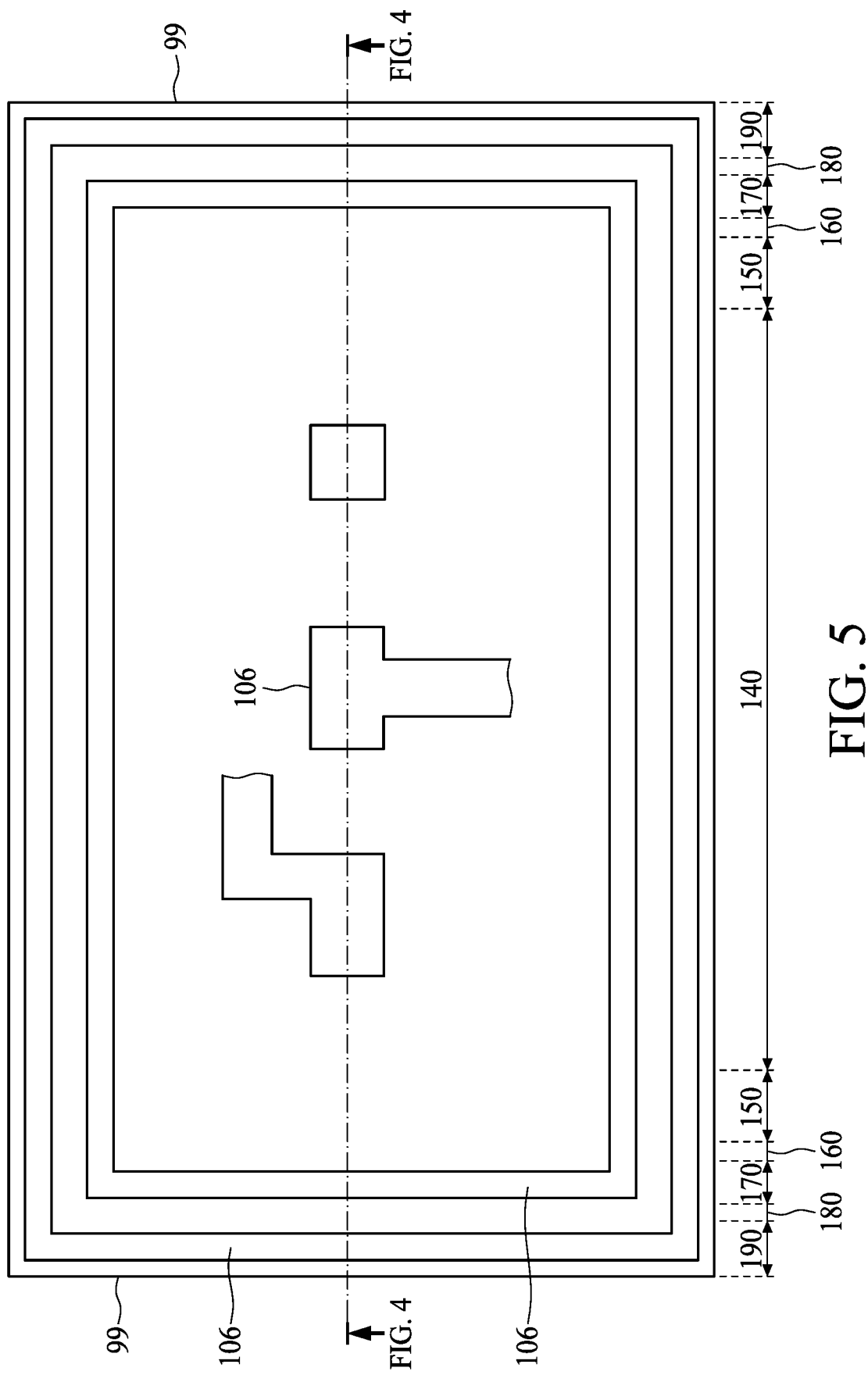
FIG. 5 illustrates, in a schematic top-view diagram, a semiconductor device in accordance with the embodiment shown in FIG. 4.

With reference to FIG. 1, FIG. 4, and FIG. 5, at step S08, a second insulating layer 105 is formed on the first insulating layer 103. The second insulating layer 105 is formed of, for example, a dielectric material such as silicon oxide, silicon nitride, fluorinated silicate glass, or porous silicon oxide. Preferably, the second insulating layer 105 is formed of a material having a dielectric constant less than 3.9. In the embodiment depicted, the second insulating layer 105 is formed of silicon oxide by chemical vapor deposition or the like. Afterward, at step S10, a plurality of first conductive layers 106 are formed in the second insulating layer 105. A second photolithography process may be used to pattern the second insulating layer 105 to define positions of the plurality of first conductive layers 106. A second etch process, such as an anisotropic dry etch process, may be performed after the second photolithography process to form a plurality of trench openings in the second insulating layer 105. After the second etch process, a conductive material, for example, aluminum, copper, tungsten, cobalt, or other suitable metal or metal alloy, is filled by a second metallization process, such as chemical vapor deposition, physical vapor deposition, sputtering, or the like, into the plurality of trench openings to form the plurality of first conductive layers 106. A second planarization process, such as chemical mechanical polishing, may be performed after the second metallization process to remove excess filling material and provide a substantially flat surface for subsequent processing steps.

With reference to FIG. 1, FIG. 4, and FIG. 5, the plurality of first conductive layers 106 are formed in the integrated circuit region 140, the first seal region 170, and the second seal region 190. From a top view, the one of the plurality of first conductive layers 106 formed in the first seal region 170 surrounds the perimeter of the first recess region 160, and the one of the plurality of first conductive layers 106 formed in the second seal region 190 surrounds the perimeter of the second recess region 180. The plurality of first conductive layers 106 formed in the integrated circuit region 140 respectively electrically couple to the plurality of contacts 104 formed in the integrated circuit region 140. The one of the plurality of first conductive layers 106 formed in the first seal region 170 electrically couples to the plurality of contacts 104 formed in the first seal region 170. The one of the plurality of first conductive layers 106 formed in the second seal region 190 electrically couples to the plurality of contacts 104 formed in the second seal region 190. Additionally, a plurality of barrier layers (not shown) may be formed on sidewalls and bottoms of the plurality of trench openings prior to the second metallization process. The plurality of barrier layers may be formed of tantalum, tantalum nitride, or the combination thereof, and may be formed by physical vapor deposition, sputtering, or the like. The plurality of barrier layers may prevent materials deposited during the second metallization process from diffusing into the first insulating layer 103 and the second insulating layer 105.

Figure 6:
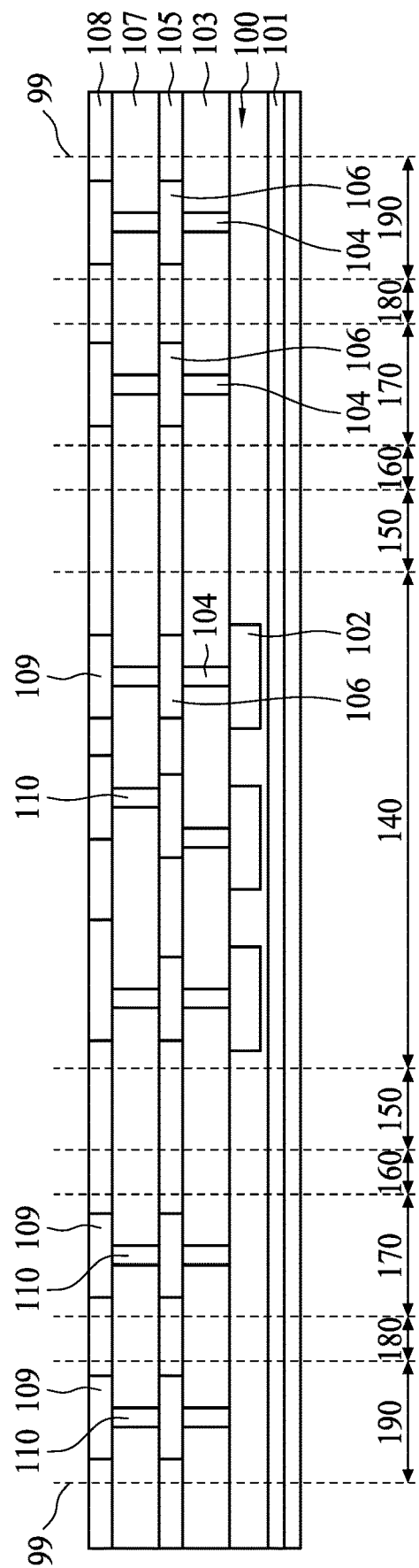
Figure 7:
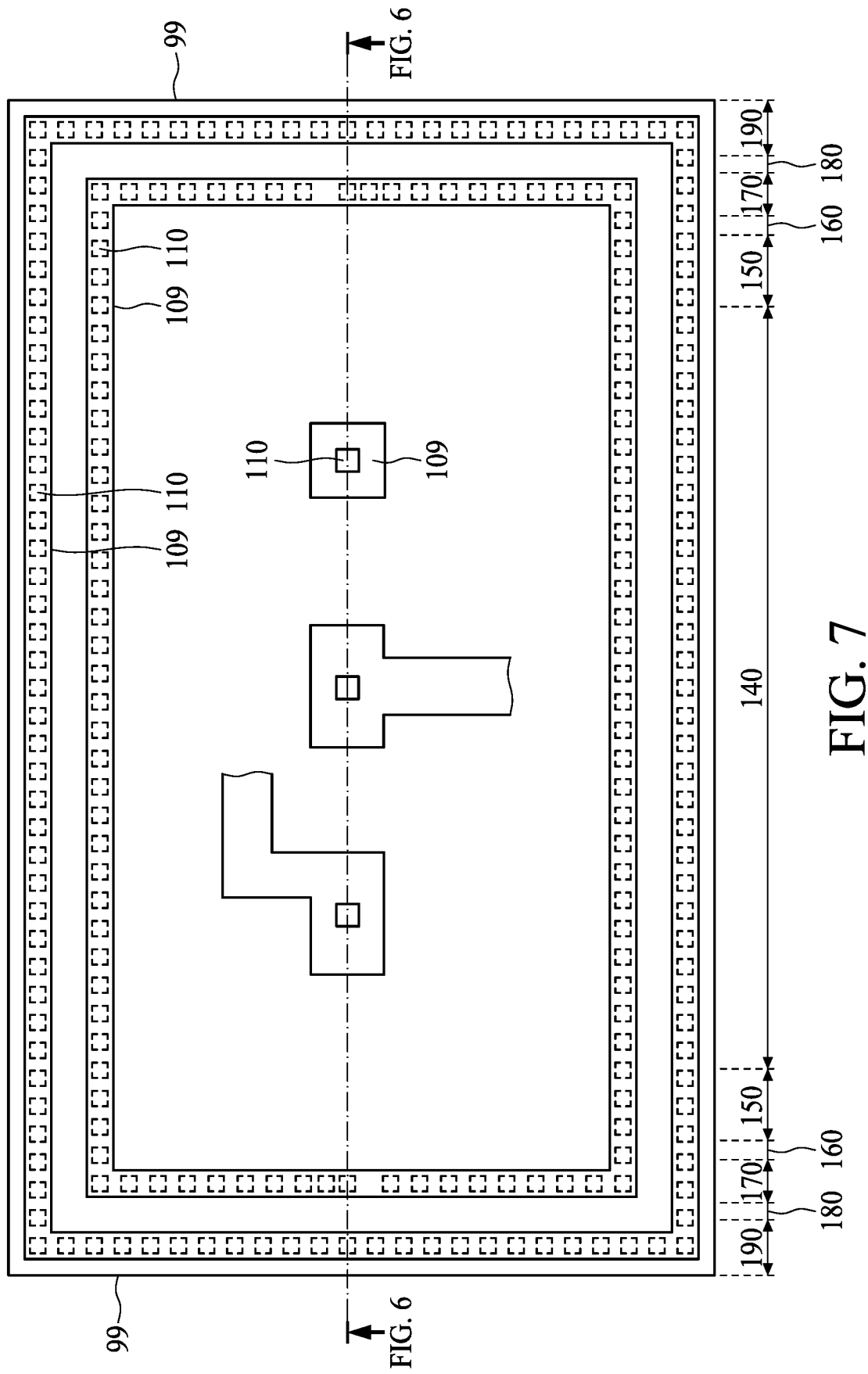
FIG. 7 illustrates, in a schematic top-view diagram, a semiconductor device in accordance with the embodiment shown in FIG. 6.

With reference to FIG. 1, FIG. 6, and FIG. 7, at step S12, a third insulating layer 107 is formed on the second insulating layer 105 and a fourth insulating layer 108 is formed on the third insulating layer 107. The third insulating layer 107 is formed of, for example, a dielectric material such as silicon oxide, porous silicon oxide, carbon-doped silicon oxide, silicon nitride, organic silicate glass, porous methylsilsesquioxane, hydrogen silsesquioxane, fluorinated silicate glass, or phosphosilicate glass. The fourth insulating layer 108 is formed of, for example, a dielectric material such as silicon oxide, porous silicon oxide, carbon-doped silicon oxide, silicon nitride, organic silicate glass, porous methyl silsesquioxane, hydrogen silsesquioxane, fluorinated silicate glass, or phosphosilicate glass. In the embodiment depicted, the third insulating layer 107 is formed of carbon-doped silicon oxide and is formed by chemical vapor deposition or the like. The fourth insulating layer 108 is formed of organic silicate glass and is formed by chemical vapor deposition or the like. Preferably, a via etch stop layer (not shown) is formed between the third insulating layer 107 and the second insulating layer 105. The via etch stop layer is formed prior to the deposition of the third insulating layer 107. The via etch stop layer is formed of, for example, silicon carbide, silicon nitride, silicon oxynitride, silicon carbo-nitride, or the like. A trench etch stop layer (not shown) is formed between the third insulating layer 107 and the fourth insulating layer 108. The trench etch stop layer is formed prior to the deposition of the fourth insulating layer 108. The trench etch stop layer is formed of, for example, silicon carbide, silicon nitride, silicon oxynitride, silicon carbo-nitride, or the like.

Next, with reference to FIG. 1, FIG. 6, and FIG. 7, at step S14, a plurality of second conductive layers 109 are formed in the fourth insulating layer 108 and a plurality of first vias 110 are formed in the third insulating layer 107. In the embodiment depicted, a third photolithography process may be used to pattern the fourth insulating layer 108 to define positions of the plurality of second conductive layers 109. A third etch process, such as an anisotropic dry etch process, may be performed after the third photolithography process to form a plurality of trench openings in the fourth insulating layer 108. After the third etch process, a fourth photolithography process may be used to pattern the third insulating layer 107 to define positions of the plurality of first vias 110. A fourth etch process, such as an anisotropic dry etch process, may be performed after the third photolithography process to form a plurality of via openings in the third insulating layer 107. After the fourth etch process, a conductive material, for example, aluminum, copper, tungsten, cobalt, or other suitable metal or metal alloy, is filled by a third metallization process, such as chemical vapor deposition, physical vapor deposition, sputtering, electroplating, electroless plating, or the like, into the plurality of trench openings and the plurality of via openings to form the plurality of second conductive layers 109 and the plurality of first vias 110. A third planarization process, such as chemical mechanical polishing, may be performed after the third metallization process to remove excess filling material and provide a substantially flat surface for subsequent processing steps.

With reference to FIG. 1, FIG. 6, and FIG. 7, the plurality of second conductive layers 109 are formed in the integrated circuit region 140, the first seal region 170, and the second seal region 190. The plurality of first vias 110 are formed in the integrated circuit region 140, the first seal region 170, and the second seal region 190. From a top view, the one of the plurality of second conductive layers 109 formed in the first seal region 170 surrounds the perimeter of the first recess region 160, and the one of the plurality of second conductive layer 109 formed in the second seal region 190 surrounds the perimeter of the second recess region 180. The plurality of first vias 110 formed in the first seal region 170 are positioned adjacent to the perimeter of the first recess region 160 and surround the first recess region 160. The plurality of first vias 110 formed in the second seal region 190 are positioned adjacent to the perimeter of the second recess region 180 and surround the second recess region 180. The plurality of first vias 110 formed in the integrated circuit region 140 respectively electrically couple to the plurality of first conductive layers 106 formed in the integrated circuit region 140. The plurality of first vias 110 formed in the first seal region 170 respectively electrically couple to the one of the plurality of first conductive layers 106 formed in the first seal region 170. The plurality of first vias 110 formed in the second seal region 190 respectively electrically couple to the one of the plurality of first conductive layers 106 formed in the second seal region 190. The plurality of second conductive layers 109 formed in the integrated circuit region 140 respectively electrically couple to the plurality of first vias 110 formed in the integrated circuit region 140. The one of the plurality of second conductive layers 109 formed in the first seal region 170 electrically couples to the plurality of first vias 110 formed in the first seal region 170. The one of the plurality of second conductive layers 109 formed in the second seal region 190 electrically couples to the plurality of first vias formed in the second seal region 190. Additionally, a plurality of barrier layers (not shown) may be formed on sidewalls and bottoms of the plurality of trench openings and on sidewalls and bottoms of the plurality of via openings prior to the third metallization process. The plurality of barrier layers may be formed of tantalum, tantalum nitride, or the combination thereof, and may be formed by physical vapor deposition, sputtering, or the like. The plurality of barrier layers may prevent materials deposited in the third metallization process from diffusing into the third insulating layer 107 and the fourth insulating layer 108.

Figure 8:
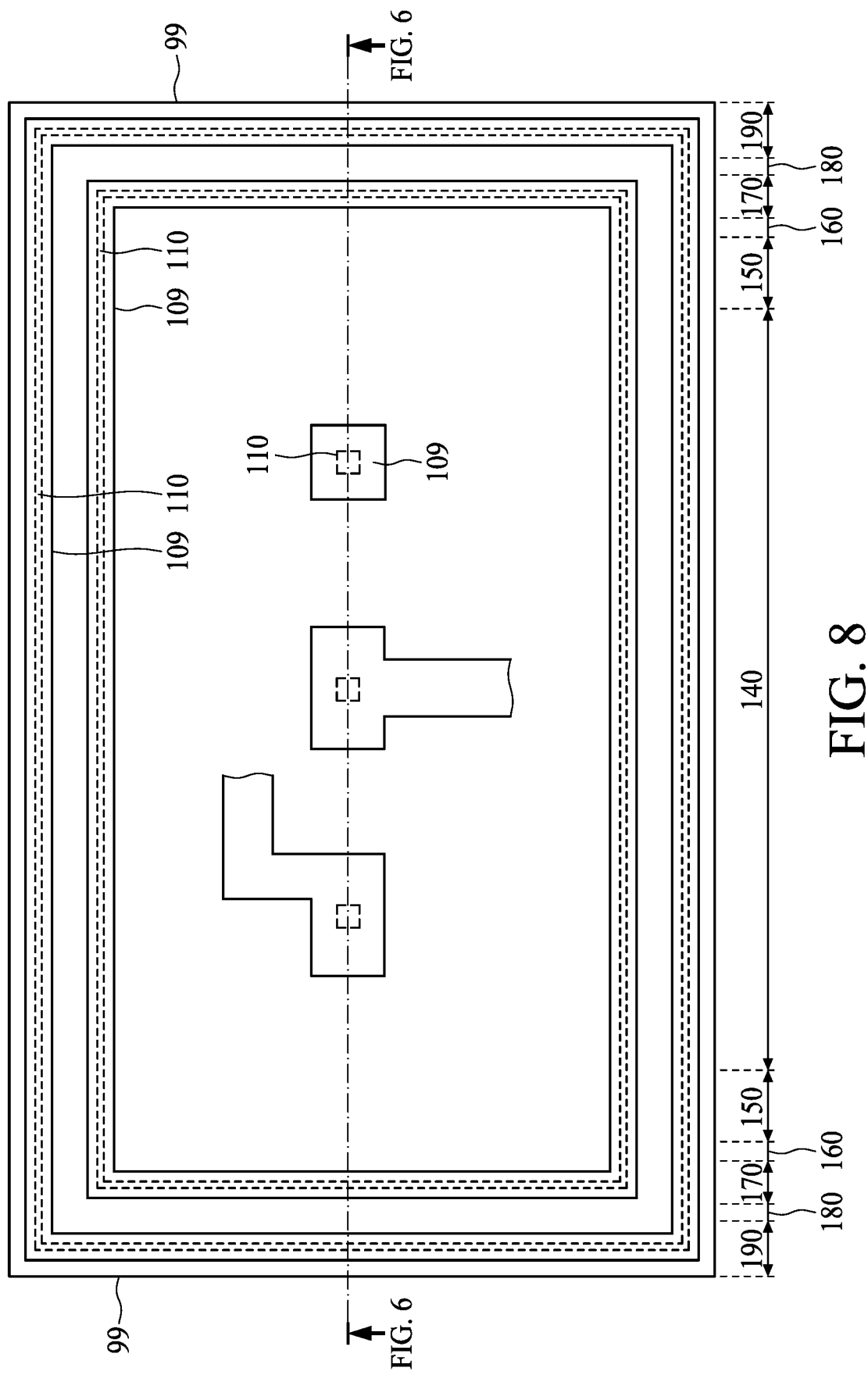
FIG. 8 illustrates, in a schematic top-view diagram, another semiconductor device in accordance with the embodiment shown in FIG. 6.

Alternatively, in another embodiment depicted, with reference to FIG. 8, the plurality of first vias 110 formed in the first seal region 170 may be interconnected to form a continuous via bar 110. The plurality of first vias 110 formed in the second seal region 190 may be interconnected to form a continuous via bar 110. The continuous via bar 110 may provide more mechanical reinforcement to the semiconductor device than that provided by the plurality of first vias 110 to the semiconductor device.

Figure 9:
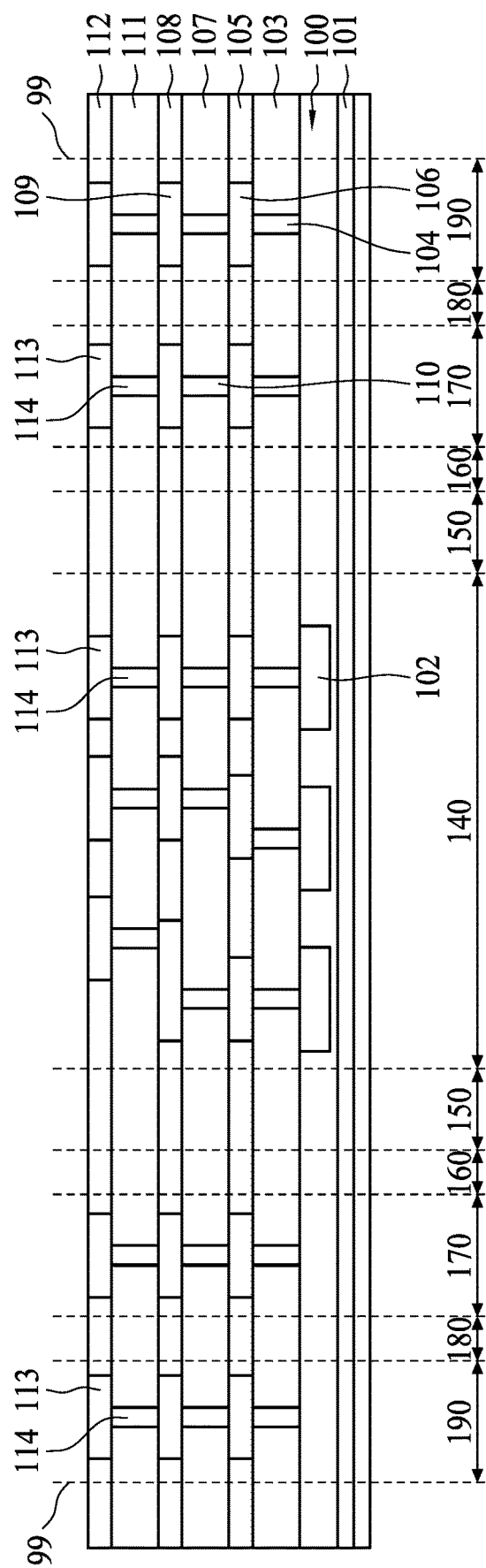

With reference to FIG. 1 and FIG. 9, at step S16, a fifth insulating layer 111 is formed on the fourth insulating layer 108. The fifth insulating layer 111 is formed of, for example, a dielectric material such as silicon oxide, porous silicon oxide, carbon-doped silicon oxide, silicon nitride, organic silicate glass, porous methyl silsesquioxane, hydrogen silsesquioxane, fluorinated silicate glass, or phosphosilicate glass. In the embodiment depicted, the fifth insulating layer 111 is formed of hydrogen silsesquioxane and is formed by chemical vapor deposition or the like. A via etch stop layer (not shown) is formed prior to the deposition of the fifth insulating layer 111 and is formed between the fourth insulating layer 108 and the fifth insulating layer 111. The via etch stop layer is formed of, for example, silicon carbide, silicon nitride, silicon oxynitride, silicon carbo-nitride, or the like. The via etch stop layer is formed by chemical vapor deposition or the like. A mask layer (not shown) is formed on the fifth insulating layer 111 and is formed of, for example, silicon carbide, silicon nitride, silicon oxynitride, silicon carbo-nitride, or the like. The mask layer is formed by chemical vapor deposition or the like. A fifth photolithography process may be used to pattern the mask layer to define positions of a plurality of second vias 114. A fifth etch process may be performed after the fifth photolithography process to form a plurality of openings in the mask layer.

With reference to FIG. 1 and FIG. 9, at step S18, a sixth insulating layer 112 is formed on the mask layer, a plurality of third conductive layers 113 are formed in the sixth insulating layer 112, and the plurality of second vias 114 are formed in the fifth insulating layer 111. The sixth insulating layer 112 is formed of, for example, a dielectric material such as silicon oxide, porous silicon oxide, carbon-doped silicon oxide, silicon nitride, organic silicate glass, porous methylsilsesquioxane, hydrogen silsesquioxane, fluorinated silicate glass, or phosphosilicate glass. In the embodiment depicted, the sixth insulating layer 112 is formed of fluorinated silicate glass and is formed by chemical vapor deposition or the like. A sixth photolithography process may be used to pattern the sixth insulating layer 112 to define positions of the plurality of third conductive layers 113. The positions of the plurality of third conductive layers 113 respectively overlap the plurality of openings formed in the mask layer. A sixth etch process, such as an anisotropic dry etch process, may be performed after the sixth photolithography process to form a plurality of trench openings in the sixth insulating layer 112 and a plurality of via openings in the fifth insulating layer 111. After the sixth etch process, a conductive material, for example, aluminum, copper, tungsten, cobalt, or other suitable metal or metal alloy, is filled by a fourth metallization process, such as chemical vapor deposition, physical vapor deposition, sputtering, electroplating, electroless plating, or the like, into the plurality of trench openings and the plurality of via openings to form the plurality of third conductive layers 113 and the plurality of second vias 114. A fourth planarization process, such as chemical mechanical polishing, may be performed after the fourth metallization process to remove excess filling material and provide a substantially flat surface for subsequent processing steps.

With reference to FIG. 1 and FIG. 9, the plurality of third conductive layers 113 are formed in the integrated circuit region 140, the first seal region 170, and the second seal region 190. The plurality of second vias 114 are formed in the integrated circuit region 140, the first seal region 170, and the second seal region 190. The plurality of second vias 114 formed in the integrated circuit region 140 respectively electrically couple to the plurality of second conductive layers 109 formed in the integrated circuit region 140. The plurality of second vias 114 formed in the first seal region 170 respectively electrically couple to the one of the plurality of second conductive layers 109 formed in the first seal region 170. The plurality of second vias 114 formed in the second seal region 190 respectively electrically couple to the one of the plurality of second conductive layers 109 formed in the second seal region 190. The plurality of third conductive layers 113 formed in the integrated circuit region 140 respectively electrically couple to the plurality of second vias 114 formed in the integrated circuit region 140. The one of the plurality of third conductive layers 113 formed in the first seal region 170 electrically couples to the plurality of second vias 114 formed in the first seal region 170. The one of the plurality of third conductive layers 113 formed in the second seal region 190 electrically couples to the plurality of second vias 114 formed in the second seal region 190. Additionally, a plurality of barrier layers (not shown) may be formed on sidewalls and bottoms of the plurality of trench openings and on sidewalls and bottoms of the plurality of via openings prior to the fourth metallization process. The plurality of barrier layers may be formed of tantalum, tantalum nitride, or the combination thereof, and may be formed by physical vapor deposition, sputtering, or the like. The plurality of barrier layers may prevent materials deposited in the fourth metallization process from diffusing into the fifth insulating layer 111 and the sixth insulating layer 112.

Figure 10:
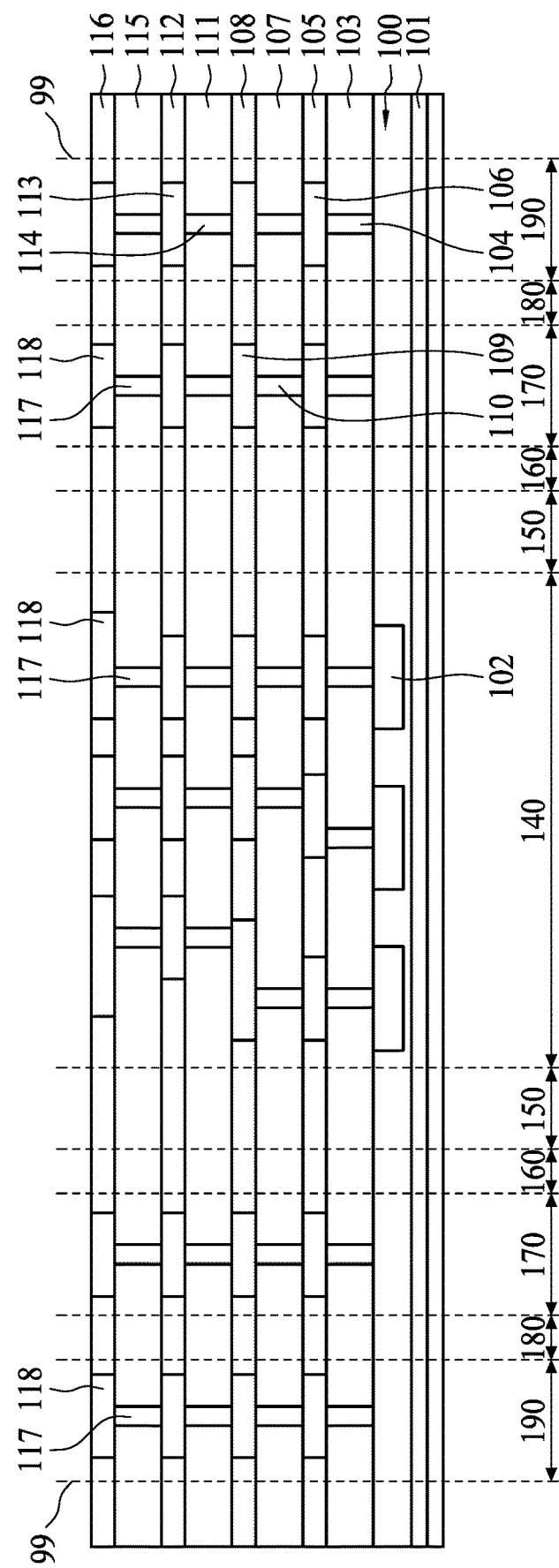

With reference to FIG. 1 and FIG. 10, at step 20, a seventh insulating layer 115 is formed on the sixth insulating layer 112 and an eighth insulating layer 116 is formed on the seventh insulating layer 115. The seventh insulating layer 115 is formed of, for example, a dielectric material such as silicon oxide, porous silicon oxide, carbon-doped silicon oxide, silicon nitride, organic silicate glass, porous methylsilsesquioxane, hydrogen silsesquioxane, fluorinated silicate glass, or phosphosilicate glass. The eighth insulating layer 116 is formed of, for example, a dielectric material such as silicon oxide, porous silicon oxide, carbon-doped silicon oxide, silicon nitride, organic silicate glass, porous methylsilsesquioxane, hydrogen silsesquioxane, fluorinated silicate glass, or phosphosilicate glass. In the embodiment depicted, the seventh insulating layer 115 is formed of silicon nitride and is formed by chemical vapor deposition or the like. The eighth insulating layer 116 is formed of porous methylsilsesquioxane and is formed by chemical vapor deposition or the like. A via etch stop layer (not shown) is formed between the sixth insulating layer 112 and the seventh insulating layer 115. The via etch stop layer is formed prior to the deposition of the seventh insulating layer 115. The via etch stop layer is formed of, for example, silicon carbide, silicon nitride, silicon oxynitride, silicon carbo-nitride, or the like. A trench etch stop layer (not shown) is formed between the seventh insulating layer 115 and the eighth insulating layer 116. The trench etch stop layer is formed prior to the deposition of the eighth insulating layer 116. The trench etch stop layer is formed of, for example, silicon carbide, silicon nitride, silicon oxynitride, silicon carbo-nitride, or the like.

Afterward, with reference to FIG. 1 and FIG. 10, at step S22, a plurality of third vias 117 are formed in the seventh insulating layer 115 and a plurality of fourth conductive layers 118 are formed in the eighth insulating layer 116. In the embodiment depicted, a seventh photolithography process may be used to pattern the eighth insulating layer 116 to define positions of the plurality of third vias. A seventh etch process, such as an anisotropic dry etch process, may be performed after the seventh photolithography process to form a plurality of via openings in the seventh insulating layer 115. After the seventh etch process, an eighth photolithography process may be used to pattern the eighth insulating layer 116 to define positions of the plurality of fourth conductive layers 118. The positions of the plurality of fourth conductive layers 118 overlap the plurality of via openings in the seventh insulating layer 115. During the eighth photolithography process, the plurality of via openings in the seventh insulating layer 115 are filled with photoresist. An eighth etch process, such as an anisotropic dry etch process, may be performed after the eighth photolithography process to form a plurality of trench openings in the eighth insulating layer 116. After the eighth etch process, a conductive material, for example, aluminum, copper, tungsten, cobalt, or other suitable metal or metal alloy, is filled by a fifth metallization process, such as chemical vapor deposition, physical vapor deposition, sputtering, electroplating, electroless plating, or the like, into the plurality of trench openings and the plurality of via openings to form the plurality of fourth conductive layers 118 and the plurality of third vias 117. A fifth planarization process, such as chemical mechanical polishing, may be performed after the fifth metallization process to remove excess filling material and provide a substantially flat surface for subsequent processing steps.

With reference to FIG. 1 and FIG. 10, the plurality of fourth conductive layers 118 are formed in the integrated circuit region 140, the first seal region 170, and the second seal region 190. The plurality of third vias 117 are formed in the integrated circuit region 140, the first seal region 170, and the second seal region 190. The plurality of third vias 117 formed in the integrated circuit region 140 respectively electrically couple to the plurality of third conductive layers 113 formed in the integrated circuit region 140. The plurality of third vias 117 formed in the first seal region 170 respectively electrically couple to the one of the plurality of third conductive layers 113 formed in the first seal region 170. The plurality of third vias 117 formed in the second seal region 190 respectively electrically couple to the one of the plurality of third conductive layers 113 formed in the second seal region 190. The plurality of fourth conductive layers 118 formed in the integrated circuit region 140 respectively electrically couple to the plurality of third vias 117 formed in the integrated circuit region 140. The one of the plurality of fourth conductive layers 118 formed in the first seal region 170 electrically couples to the plurality of third vias 117 formed in the first seal region 170. The one of the plurality of fourth conductive layers 118 formed in the second seal region 190 electrically couples to the plurality of third vias 117 formed in the second seal region 190. Additionally, a plurality of barrier layers (not shown) may be formed on sidewalls and bottoms of the plurality of trench openings and on sidewalls and bottoms of the plurality of via openings prior to the fifth metallization process. The plurality of barrier layers may be formed of tantalum, tantalum nitride, or the combination thereof, and may be formed by physical vapor deposition, sputtering, or the like. The plurality of barrier layers may prevent materials deposited in the fifth metallization process from diffusing into the seventh insulating layer 115 and the eighth insulating layer 116. Although only four conductive layers and three vias are shown in FIG. 10, it should be understood that more conductive layers or vias may be formed above them with the aforementioned procedures; that is to say, the present disclosure is equally applicable to process flows having any number of conductive layers and vias.

Figure 11:
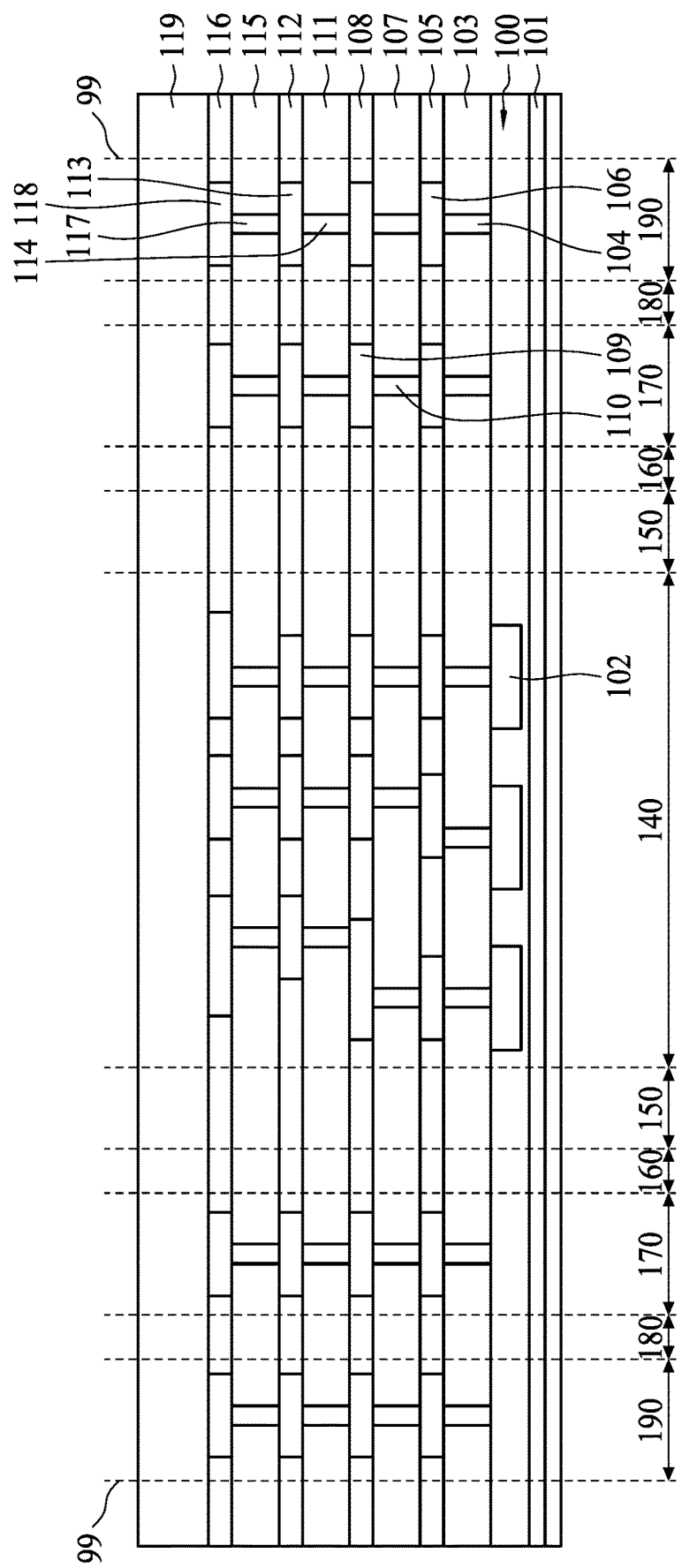

With reference to FIG. 1 and FIG. 11, at step 24, a first passivation layer 119 is formed on the eighth insulating layer 116. The first passivation layer 119 is formed of, for example, an insulating material such as silicon oxide, silicon nitride, silicon-oxy-nitride, undoped silicate glass, or the combination thereof. The first passivation layer 119 is formed by chemical vapor deposition or the like. A thickness of the first passivation layer may be about 0.2 μm to about 1.2 μm. In the embodiment depicted, the first passivation layer 119 is formed of undoped silicate glass. The plurality of fourth conductive layers 118 (in other words, the uppermost conductive layer), may be susceptible to electrical shorting cause by conductive debris associated with a die cutting process (or die saw process). The first passivation layer 119 formed of an insulating material may serve as an insulating shield over the uppermost conductive layer to avoid electrical shorting. Additionally, the first passivation layer 119 may improve the mechanical strength of the semiconductor device and prevent moisture from entering from above.

Figure 12:
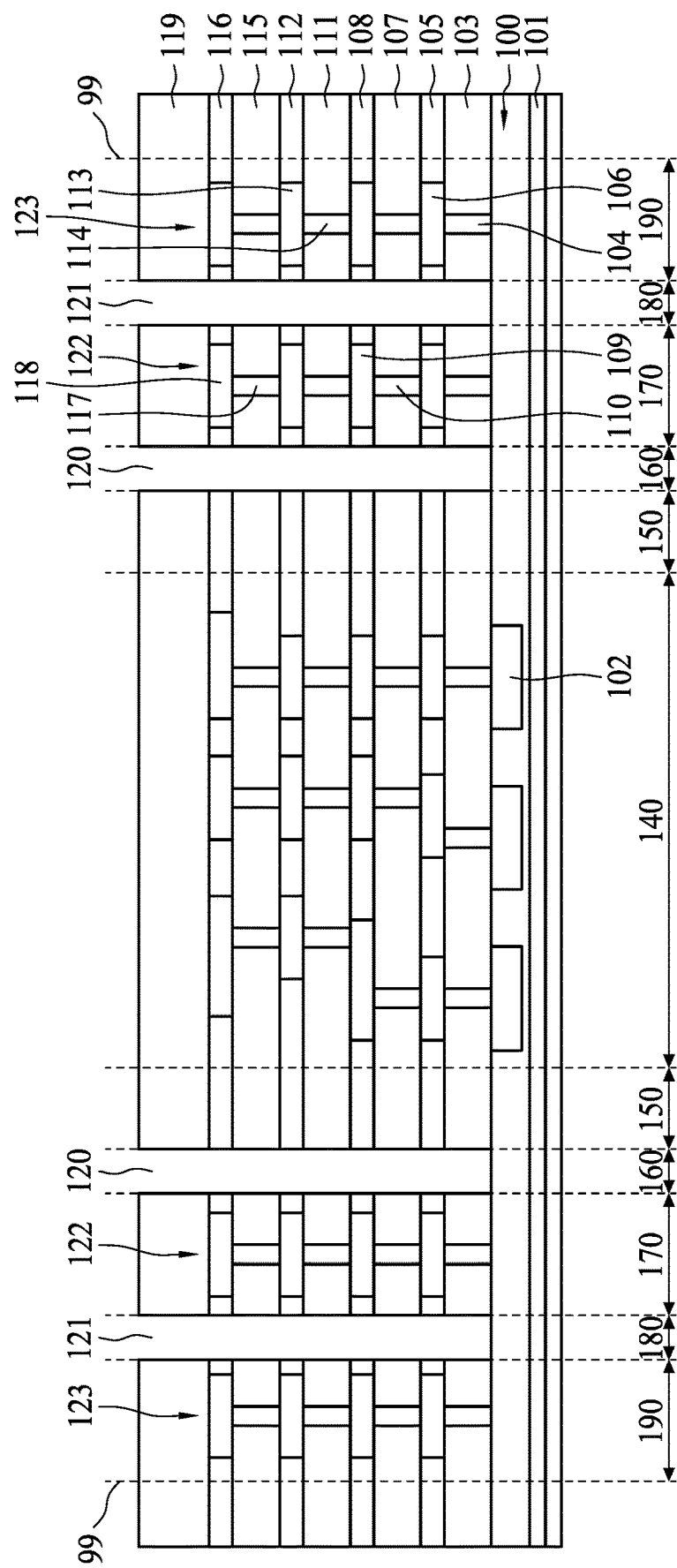
Figure 13:
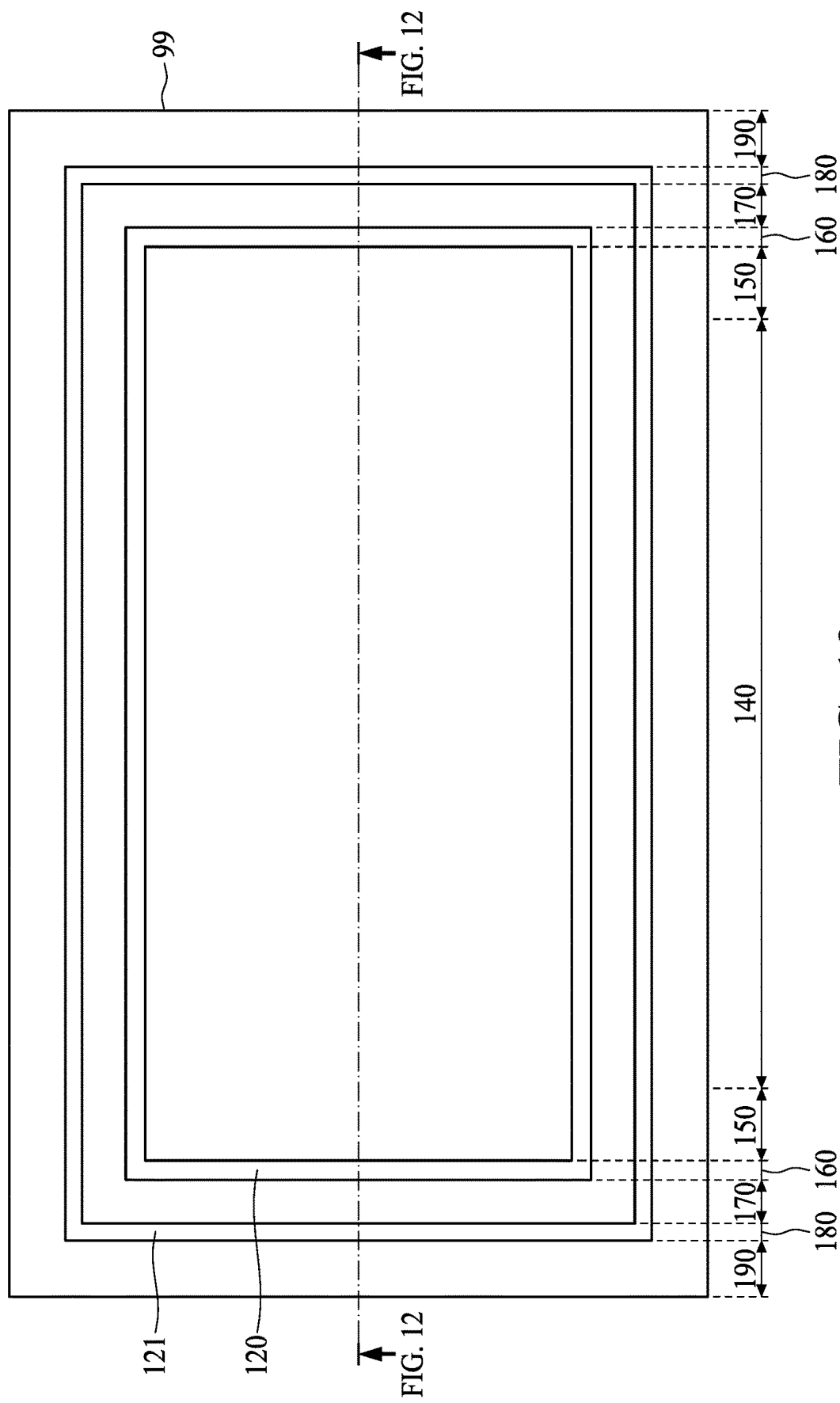
FIG. 13 illustrates, in a schematic top-view diagram, a semiconductor device in accordance with the embodiment shown in FIG. 12.
Figure 14:
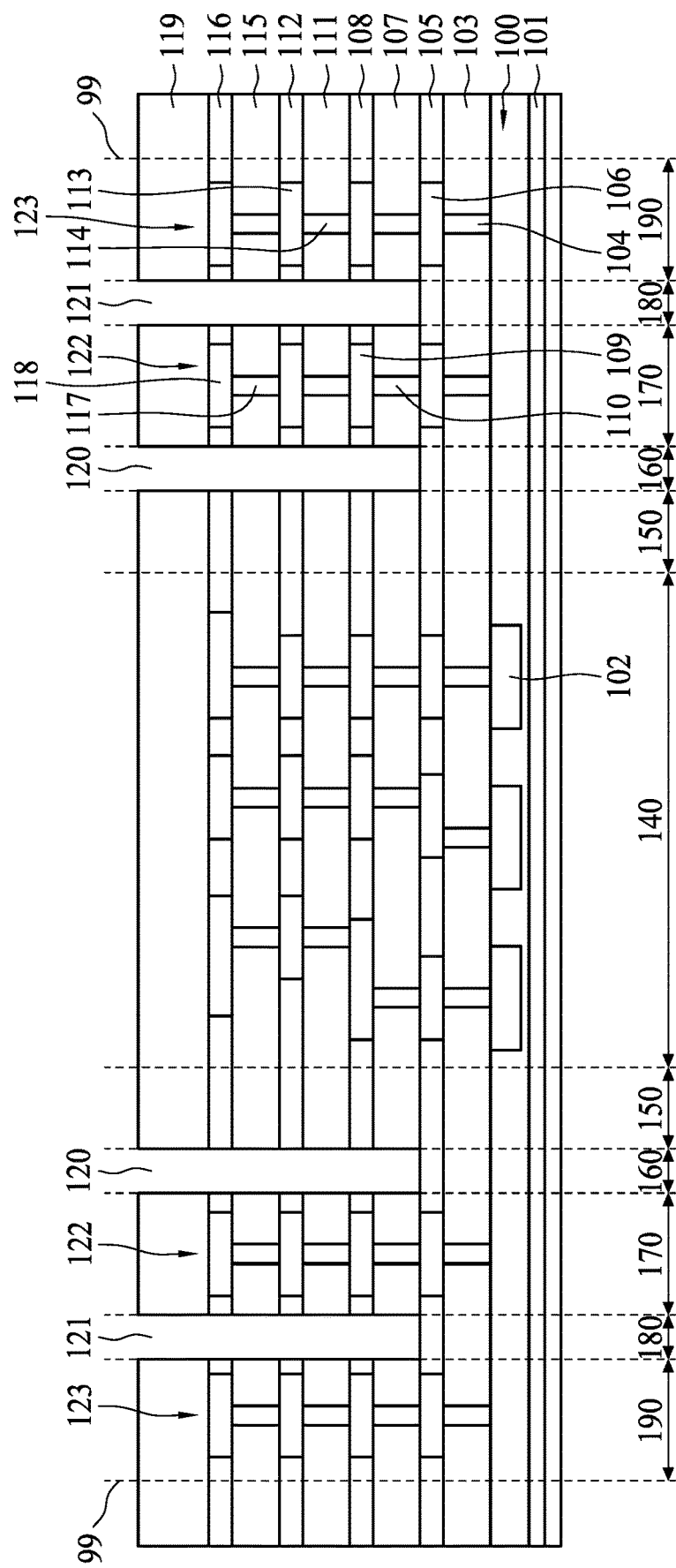
FIG. 14 illustrates, in a schematic cross-sectional diagram, a semiconductor device in accordance with an embodiment of the present disclosure.

With reference to FIG. 1, FIG. 12, and FIG. 13, at step 26, a first recess 120 is formed in the first recess region 160 and a second recess 121 is formed in the second recess region 180. From a cross-sectional view, each of the first recess 120 and the second recess 121 extends through the first passivation layer 119, the eighth insulating layer 116, the seventh insulating layer 115, the sixth insulating layer 112, the fifth insulating layer 111, the fourth insulating layer 108, the third insulating layer 107, the second insulating layer 105, and the first insulating layer 103, and extends to a top surface of the substrate 100 in the first recess region 160 and the second recess region 180. From a top view, the first recess 120 surrounds the buffer region 150. The second recess 121 surrounds the first seal region 170. The first recess 120 and the second recess 121 together form a concentric structure. A width of the first recess 120 is greater that about 1 μm to about 2 μm. A width of the second recess 121 is greater than about 1 μm to about 2 μm. The width of the first recess 120 may be the same as the width of the second recess 121, but is not limited thereto. If a crack occurs during the die cutting process and propagates toward the integrated circuit region 140, the crack may be stopped by the second recess 121 and the first recess 120. Even if the crack propagates across the second recess 121 and the first recess 120, the stress of the crack would be substantially reduced by the second recess 121 and the first recess 120; in other words, the second recess 121 and the first recess 120 may increase the stress resistance capability of the die, especially lateral stress. Alternatively, in another embodiment depicted, the first recess 120 and the second recess 121 may extend only to any level between a top surface of the first passivation layer 119 and the top surface of the substrate 100. With reference to FIG. 14, the first recess 120 and the second recess 121 extend to a top surface of the second insulating layer 105. The first recess 120 and the second recess 121 are formed by single-step etch, multi-step etch, laser bombardment, or the like.

With reference to FIG. 12 and FIG. 13, the first recess 120 and the second recess 121 together isolate a first conductive structure 122 in the first seal region 170. The second recess 121 and the scribe line boundary 99 define a second conductive structure 123 in the second seal region 190. The one of the plurality of fourth conductive layers 118 formed in the first seal region 170, the plurality of third vias 117 formed in the first seal region 170, the one of the plurality of third conductive layers 113 formed in the first seal region 170, the plurality of second vias 114 formed in the first seal region 170, the one of the plurality of second conductive layers 109 formed in the first seal region 170, the plurality of first vias 110 formed in the first seal region 170, the one of the plurality of first conductive layers 106 formed in the first seal region 170, and the plurality of contacts 104 formed in the first seal region 170 together form the first conductive structure 122. The one of the plurality of fourth conductive layers 118 formed in the second seal region 190, the plurality of third vias 117 formed in the second seal region 190, the one of the plurality of third conductive layers 113 formed in the second seal region 190, the plurality of second vias 114 formed in the second seal region 190, the one of the plurality of second conductive layers 109 formed in the second seal region 190, the plurality of first vias 110 formed in the second seal region 190, the one of the plurality of first conductive layers 106 formed in the second seal region 190, and the plurality of contacts 104 formed in the second seal region 190 together form the second conductive structure 123.

With reference to FIG. 12 and FIG. 13, the first conductive structure 122 and the second conductive structure 123 respectively form a wall of conductive material to protect the functional circuits in the integrated circuit region 140 against potential damages. The first conductive structure 122 and the second conductive structure 123 respectively provide physical buffer areas that allow the dissipation of energy or stress induced during processes such as a die cutting process, a wire bonding process or a soldering process, or during rigorous environmental testing. The first conductive structure 122 and the second conductive structure 123 also respectively provide a protective barrier for the functional circuits in the integrated circuit region 140 to protect against infiltration by contaminants such as moisture and chemical impurities which may be generated during processes such as the die cutting process or the soldering process. In addition, the first conductive structure 122 and the second conductive structure 123 respectively couple to the highly-doped active regions (not shown) in the substrate 100 by the plurality of contacts 104 formed in the first seal region 170 and the plurality of contacts 104 formed in the second seal region 190 to be electrically grounded. Such grounding may drain away ionic contaminations generated during various semiconductor processes, and the grounding may thus prevent electromagnetic interference. In addition, the first conductive structure 122 and the second conductive structure 123 are fabricated by the same procedure as the functional circuits in the integrated circuit region 140; in other words, no extra semiconductor process is needed for fabrication of the first conductive structure 122 and the second conductive structure 123.

Figure 15:
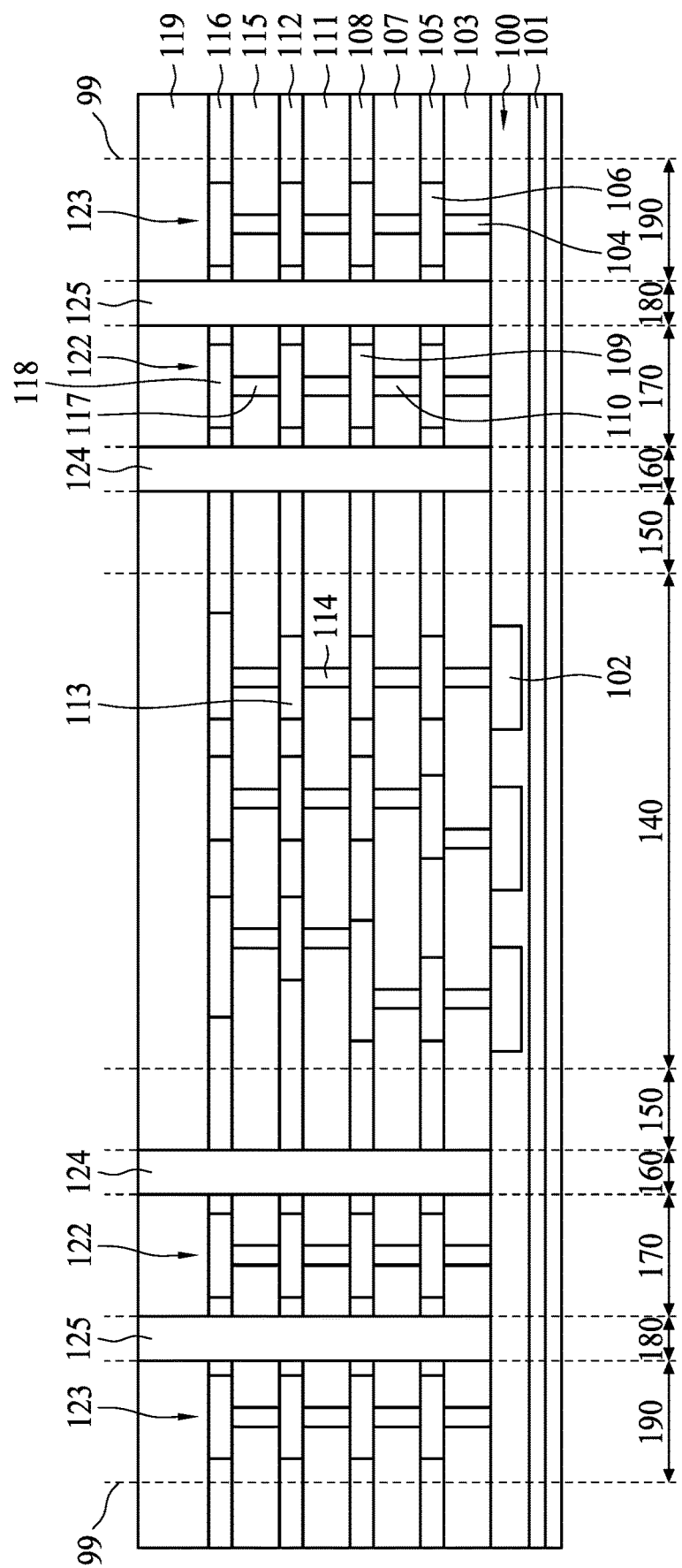

With reference to FIG. 1 and FIG. 15, at step 28, the first recess 120 and the second recess 121 are respectively refilled to form a first columnar blocking structure 124 and a second columnar blocking structure 125. The first columnar blocking structure 124 is formed of a conductive material or a dielectric material. The second columnar blocking structure 125 is formed of a conductive material or a dielectric material. The conductive material is, for example, aluminum, copper, tungsten, cobalt, or other suitable metal or metal alloy. The dielectric material is, for example, undoped silicate glass, silicon nitride, silicon-oxy-nitride, barium strontium titanate, lead zirconium titanate, titanium oxide, aluminum oxide, hafnium oxide, or zirconium oxide. The first columnar blocking structure 124 and the second columnar blocking structure 125 may present a barrier in order to prevent moisture from entering from a side. The first columnar blocking structure 124 and the second columnar blocking structure 125 may be formed of the same material, but is not limited thereto. When the first columnar blocking structure 124 and the second columnar blocking structure 125 are formed of the same material, the refilling of the first recess 120 and the second recess 121 may be conducted simultaneously to reduce the complexity of fabrication of the semiconductor device.

Figure 16:
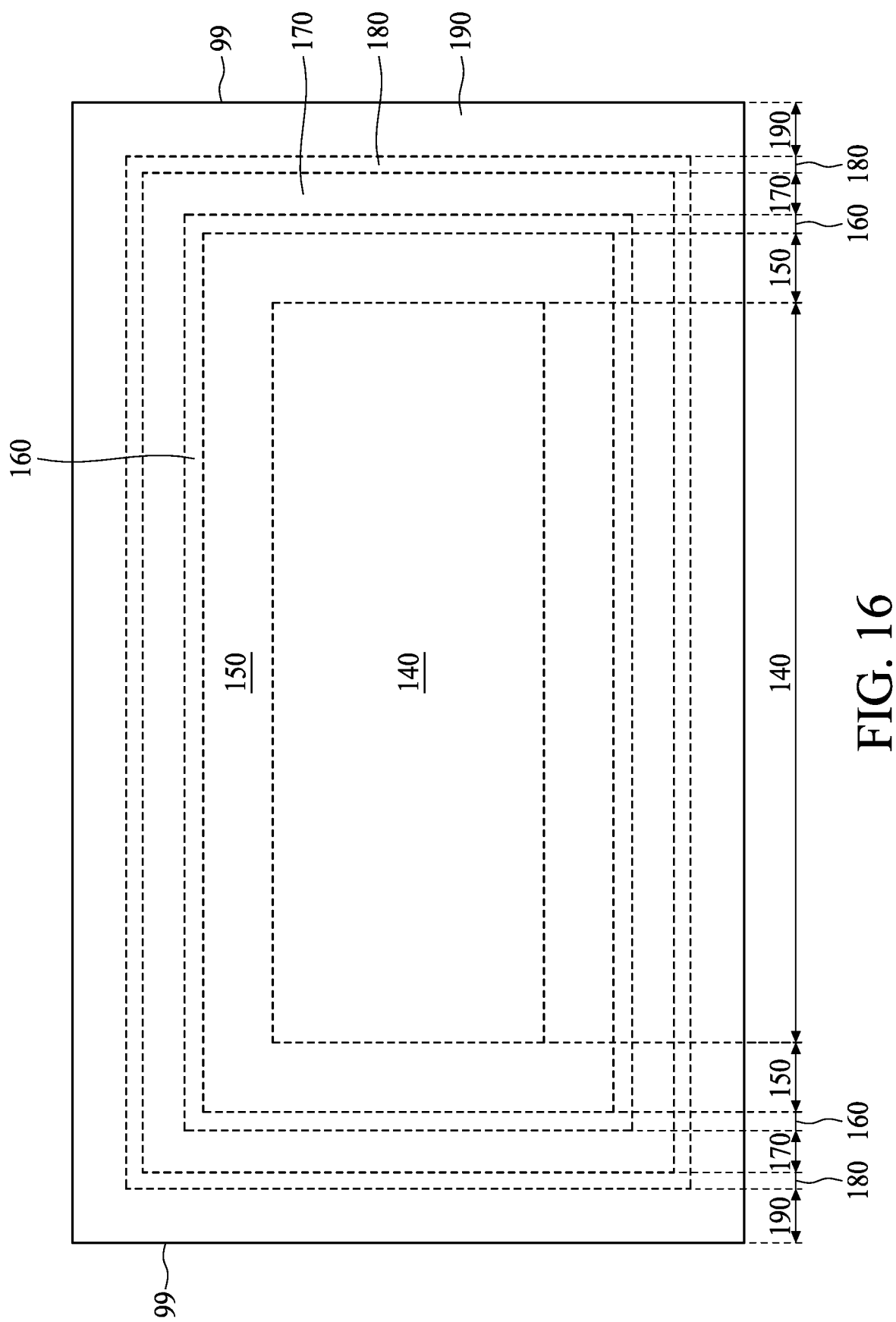
FIG. 16 illustrates, in a schematic top-view diagram, a semiconductor device in accordance with an embodiment of the present disclosure.

With reference to FIG. 12 and FIG. 16, in one embodiment depicted, a semiconductor device includes a die, wherein an area of the die is defined by a scribe line boundary 99. The die includes an integrated circuit region 140, a buffer region 150, a first recess region 160, a first seal region 170, a second recess region 180, and a second seal region 190. The integrated circuit region 140 includes semiconductor components 102 disposed therein and the semiconductor components 102 couple to each other to form functional circuits. The buffer region 150 surrounds the integrated circuit region 140 and is between the integrated circuit region 140 and the first recess region 160. The first recess region 160 surrounds the buffer region 150 and surrounds the integrated circuit region 140 with the buffer region 150 interposed therebetween. The first seal region 170 surrounds the first recess region 160 and surrounds the integrated circuit region 140 with the buffer region 150 and the first recess region 160 interposed therebetween. The second recess region 180 surrounds the first seal region 170 and surrounds the integrated circuit region 140 with the buffer region 150, the first recess region 160, and the first seal region 170 interposed therebetween. The second seal region 190 surrounds the second recess region 180 and is adjacent to the scribe line boundary 99. The second seal region 190 surrounds the integrated circuit region 140 with the buffer region 150, the first recess region 160, the first seal region 170, and the second recess region 180 interposed therebetween.

With reference to FIG. 12 and FIG. 16, a first conductive structure 122 is disposed in the first seal region 170 and a second conductive structure 123 is disposed in the second seal region 190. The first conductive structure 122 includes a plurality of insulating layers 103, 105, 107, 108, 111, 112, 115, 116 in the first seal region 170, a plurality of conductive layers 106, 109, 113, 118 in the first seal region 170, and a plurality of vias 104, 110, 114, 117 in the first seal region 170. The plurality of insulating layers 103, 105, 107, 108, 111, 112, 115, 116 in the first seal region 170 are stacked on a substrate 100 of the die. The plurality of conductive layers 106, 109, 113, 118 in the first seal region 170 are disposed among some of the plurality of insulating layers 105, 108, 112, 116 in the first seal region 170. The plurality of vias 104, 110, 114, 117 in the first seal region 170 pass through the other of the plurality of insulating layers 103, 107, 111, 115 in the first seal region 170 to electrically connect to the plurality of conductive layers 106, 109, 113, 118 in the first seal region 170. The lowest vias 104 in the first seal region 170 respectively couple to highly-doped active regions (not shown) in the substrate 100 to be electrically grounded.

With reference to FIG. 12 and FIG. 16, the second conductive structure 123 includes a plurality of insulating layers 103, 105, 107, 108, 111, 112, 115, 116 in the second seal region 190, a plurality of conductive layers 106, 109, 113, 118 in the second seal region 190, and a plurality of vias 104, 110, 114, 117 in the second seal region 190. The plurality of insulating layers 103, 105, 107, 108, 111, 112, 115, 116 in the second seal region 190 are stacked on the substrate 100 of the die. The plurality of conductive layers 106, 109, 113, 118 in the second seal region 190 are disposed among some of the plurality of insulating layers 105, 108, 112, 116 in the second seal region 190. The plurality of vias 104, 110, 114, 117 in the second seal region 190 pass through the other of the plurality of insulating layers 103, 107, 111, 115 in the second seal region 190 to electrically connect to the plurality of conductive layers 106, 109, 113, 118 in the second seal region 190. The lowest vias 104 in the second seal region 190 respectively couple to the highly-doped active regions (not shown) in the substrate 100 to be electrically grounded.

Note that the plurality of conductive layers 106, 109, 113, 118 may be referred to as a plurality of first conductive layers, a plurality of second conductive layers, and so on. This includes embodiments where the plurality of conductive layers 106 are referred to as the plurality of first conductive layers, the plurality of conductive layers 109 are referred to as the plurality of second conductive layers, and so on. The plurality of vias 104, 110, 114, 117 may be referred to as a plurality of contacts, a plurality of first vias, a plurality of second vias, and so on. This includes embodiments where the plurality of vias 104 are referred to as the plurality of contacts, the plurality of vias 110 are referred to as the plurality of first vias, and so on. The plurality of insulating layers 103, 105, 107, 108, 111, 112, 115, 116 may be referred to as a plurality of first insulating layers, a plurality of second insulating layers, and so on. This includes embodiments where the plurality of insulating layers 103 are referred to as the plurality of first insulating layers, the plurality of insulating layers 105 are referred to as the plurality of second insulating layers, and so on.

With reference to FIG. 12 and FIG. 16, a first passivation layer 119 is disposed on the first conductive structure 122 and the second conductive structure 123 to cover the first conductive structure 122 and the second conductive structure 123. A first recess 120 is disposed in the first recess region 160 and a second recess 121 is disposed in the second recess region 180. The first conductive structure 122 and the second conductive structure 123 are separated by the second recess 121. The first conductive structure 122 and the semiconductor components 102 in the integrated circuit region 140 are separated by the first recess 120.

The first recess 120 and the second recess 121 of the semiconductor device may stop a crack propagating toward the integrated circuit region 140 or reduce the stress of the crack, especially lateral stress. The first conductive structure 122 and the second conductive structure 123 of the semiconductor device may respectively serve as a wall to protect the integrated circuit region 140 from potential damage due to stress or infiltration by contaminants. In addition, the grounded first conductive structure 122 and the grounded second conductive structure 123 of the semiconductor device may protect the semiconductor device from electromagnetic interference. Furthermore, the first passivation layer 119 of the semiconductor device may improve the mechanical strength of the semiconductor device and prevent moisture from entering from above. Therefore, a reliable semiconductor device is provided.

With reference to FIG. 15 and FIG. 16, a semiconductor device in accordance with another embodiment is provided. In the embodiment depicted, a first conductive structure 122 is disposed in the first seal region 170 and a second conductive structure 123 is disposed in the second seal region 190. A first columnar blocking structure 124 and a second columnar blocking structure 125 are respectively disposed in the first recess region 160 and the second recess region 180.

Figure 17:
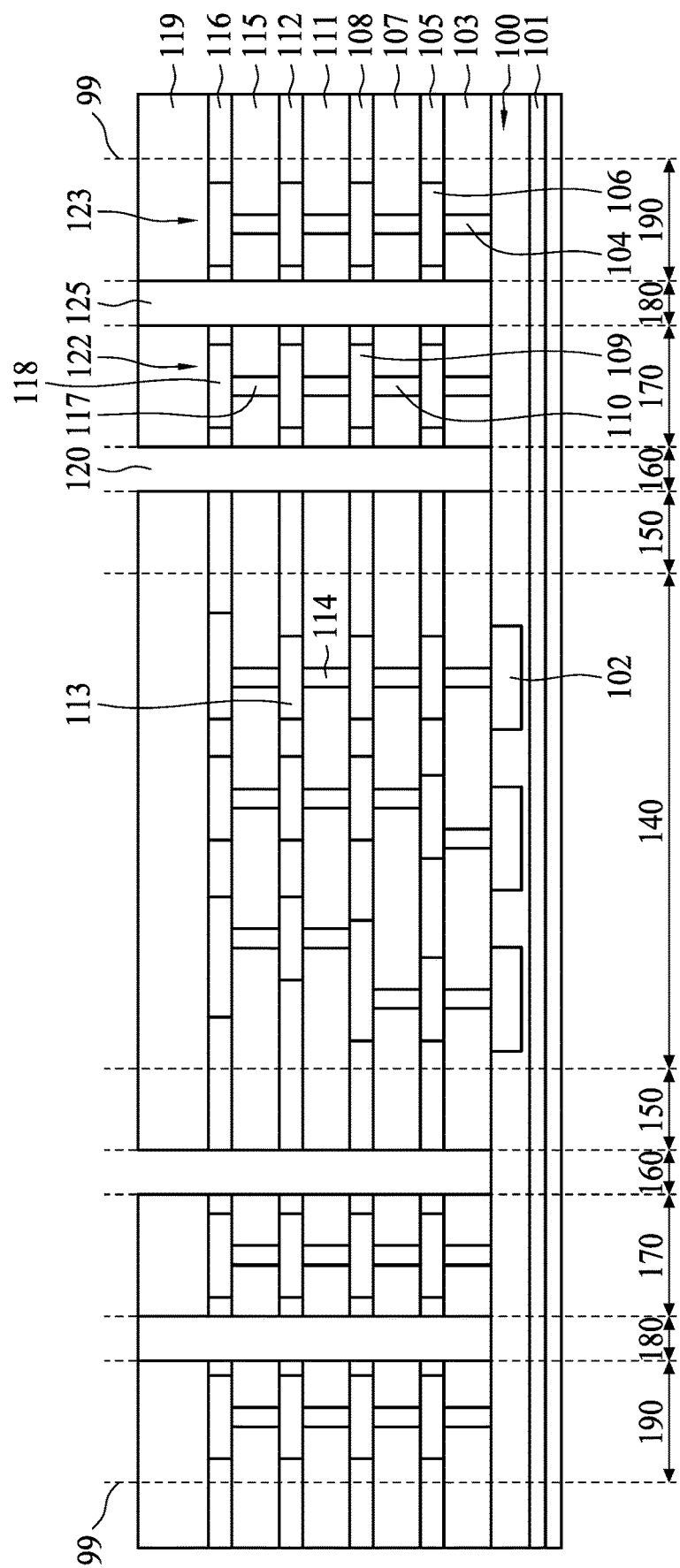
FIG. 17 to FIG. 31 and FIG. 33 illustrate, in schematic cross-sectional diagrams, semiconductor devices in accordance with some embodiments of the present disclosure.

With reference to FIG. 17, a semiconductor device in accordance with another embodiment is provided. In the embodiment depicted, a first conductive structure 122 is disposed in the first seal region 170 and a second conductive structure 123 is disposed in the second seal region 190. A first recess 120 is disposed in the first recess region 160. A second columnar blocking structure 125 is disposed in the second recess region 180.

Figure 18:
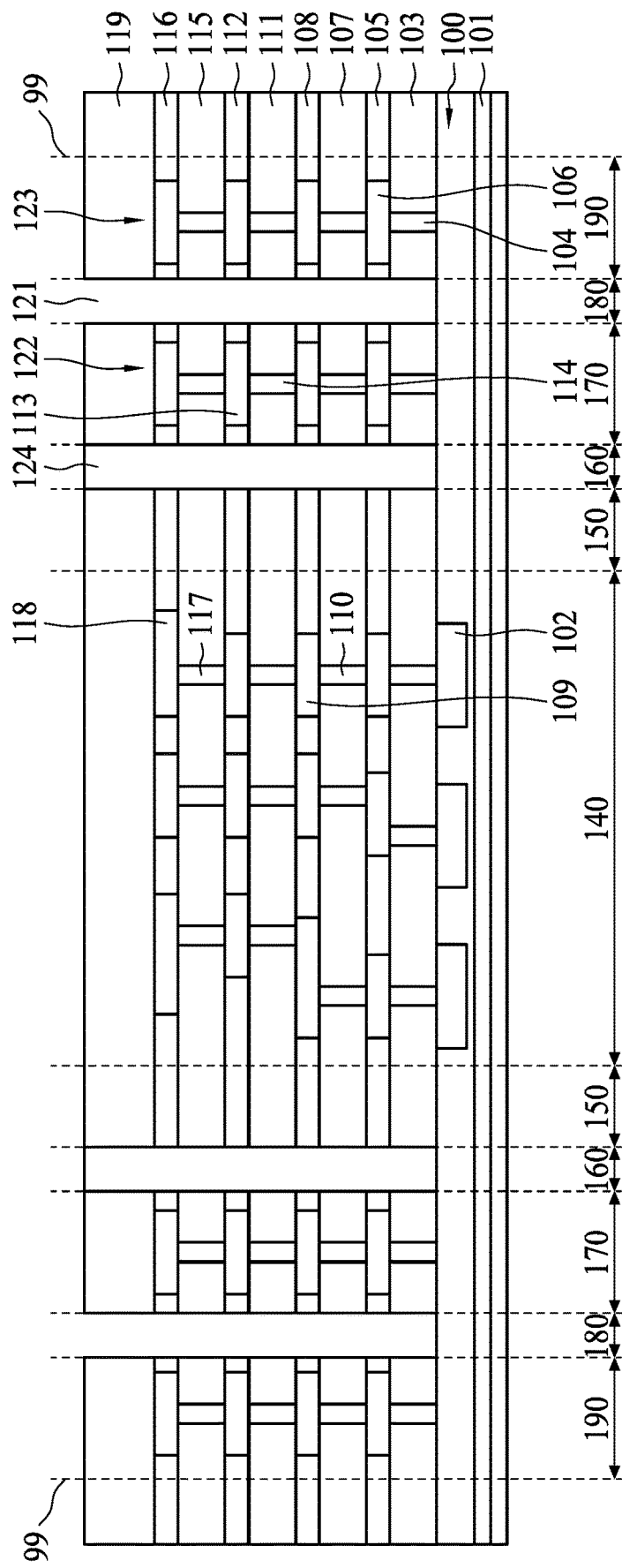

With reference to FIG. 18, a semiconductor device in accordance with another embodiment is provided. In the embodiment depicted, a first conductive structure 122 is disposed in the first seal region 170 and a second conductive structure 123 is disposed in the second seal region 190. A first columnar blocking structure 124 is disposed in the first recess region 160. A second recess 121 is disposed in the second recess region 180.

Figure 19:
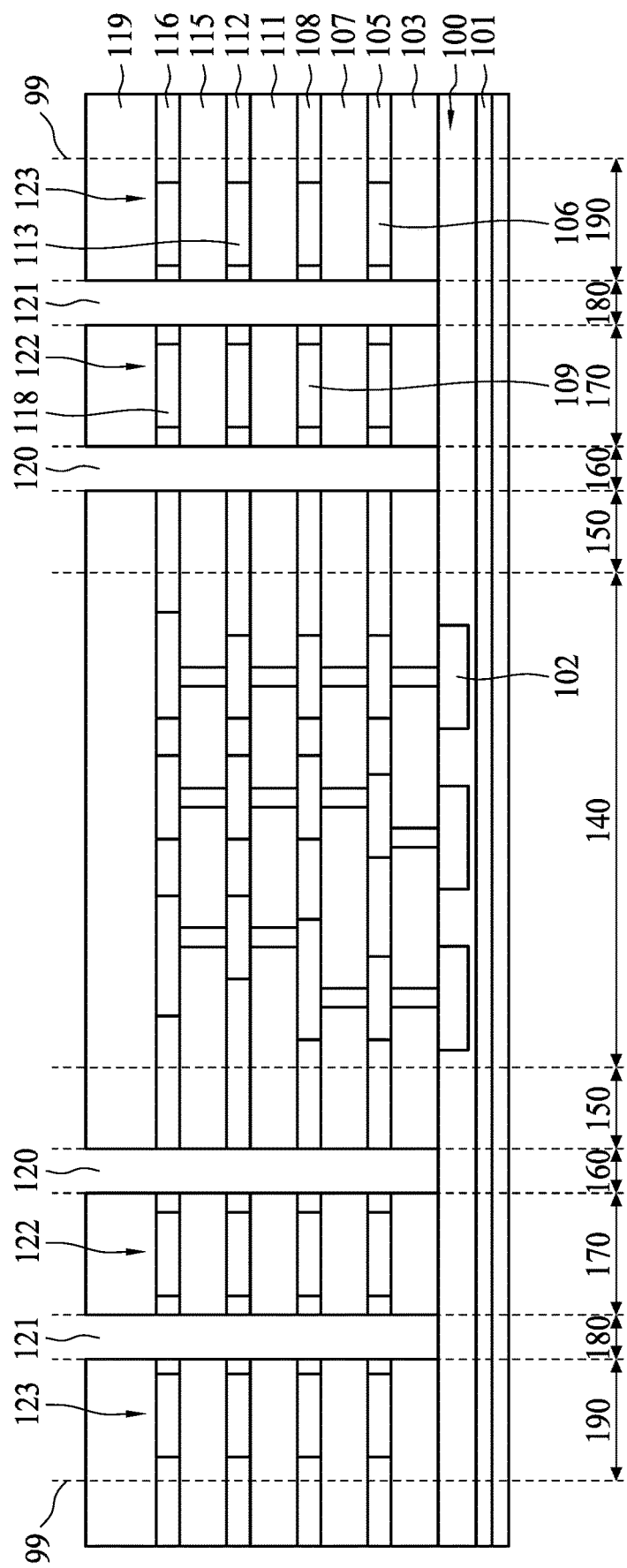

With reference to FIG. 19, a semiconductor device in accordance with another embodiment is provided. In the embodiment depicted, a first conductive structure 122 is disposed in the first seal region 170 and a second conductive structure 123 is disposed in the second seal region 190. The first conductive structure 122 includes a plurality of insulating layers 103, 105, 107, 108, 111, 112, 115, 116 in the first seal region 170 and a plurality of conductive layers 106, 109, 113, 118 in the first seal region 170. The plurality of insulating layers 103, 105, 107, 108, 111, 112, 115, 116 in the first seal region 170 are stacked on the substrate 100 of the die. The plurality of conductive layers 106, 109, 113, 118 in the first seal region 170 are disposed among some of the plurality of insulating layers 105, 108, 112, 116 in the first seal region 170. The plurality of conductive layers 106, 109, 113, 118 in the first seal region 170 are not electrically connected to each other. The second conductive structure 123 includes a plurality of insulating layers 103, 105, 107, 108, 111, 112, 115, 116 in the second seal region 190 and a plurality of conductive layers 106, 109, 113, 118 in the second seal region 190. The plurality of insulating layers 103, 105, 107, 108, 111, 112, 115, 116 in the second seal region 190 are stacked on the substrate 100 of the die. The plurality of conductive layers 106, 109, 113, 118 in the second seal region 190 are disposed among some of the plurality of insulating layers 105, 108, 112, 116 in the second seal region 190. The plurality of conductive layers 106, 109, 113, 118 in the second seal region 190 are not electrically connected to each other.

Figure 20:
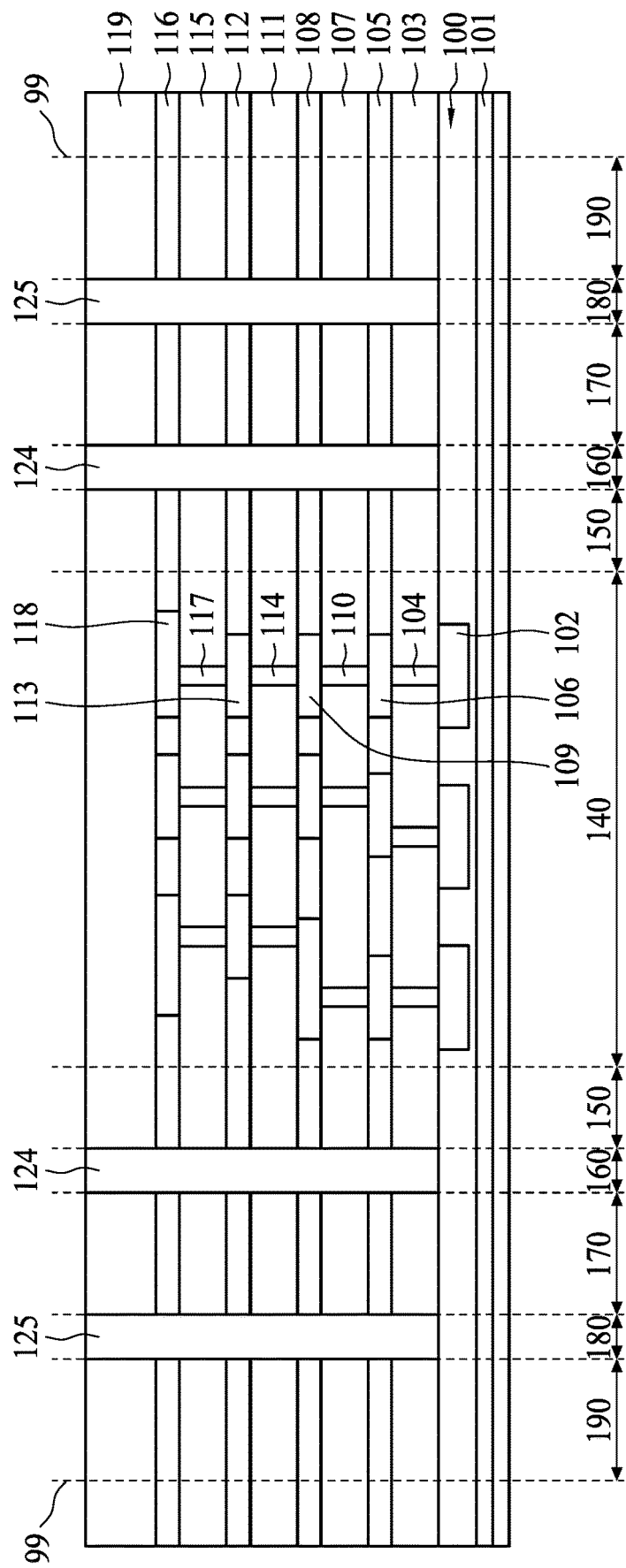

With reference to FIG. 20, a semiconductor device in accordance with another embodiment is provided. In the embodiment depicted, a first columnar blocking structure 124 and a second columnar blocking structure 125 are respectively disposed in the first recess region 160 and the second recess region 180. No conductive structure is disposed in the first seal region 170 or the second seal region 190.

Figure 21:
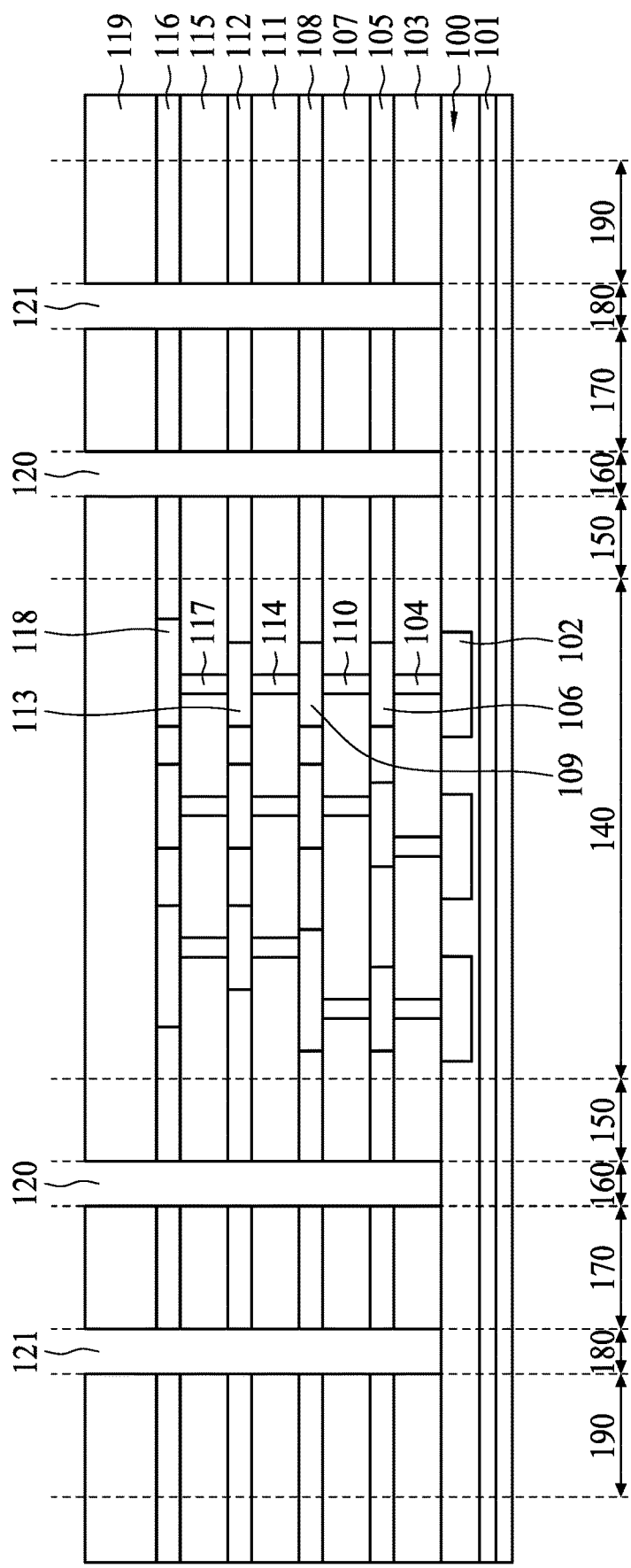

With reference to FIG. 21, a semiconductor device in accordance with another embodiment is provided. In the embodiment depicted, a first recess 120 and a second recess 121 are respectively disposed in the first recess region 160 and the second recess region 180. No conductive structure is disposed in the first seal region 170 or the second seal region 190.

Figure 22:
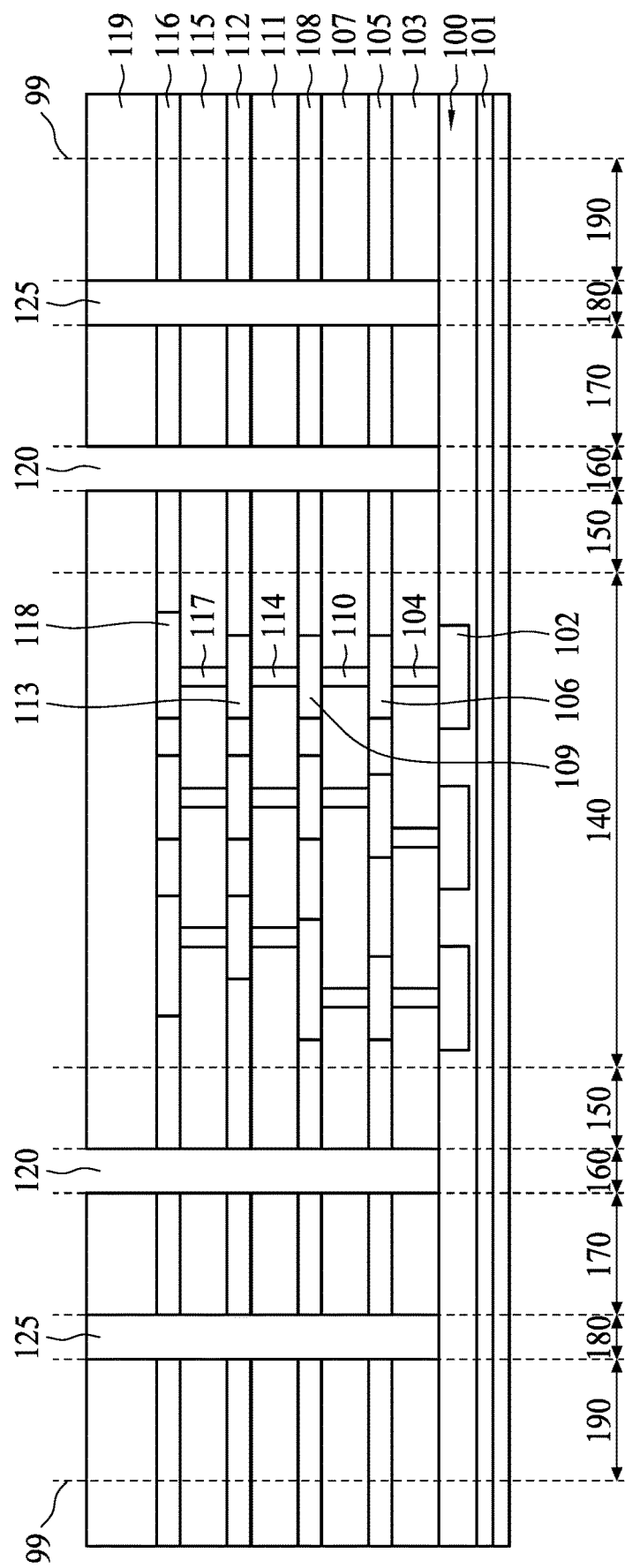

With reference to FIG. 22, a semiconductor device in accordance with another embodiment is provided. In the embodiment depicted, a first recess 120 is disposed in the first recess region 160. A second columnar blocking structure 125 is disposed in the second recess region 180. No conductive structure is disposed in the first seal region 170 or the second seal region 190.

Figure 23:
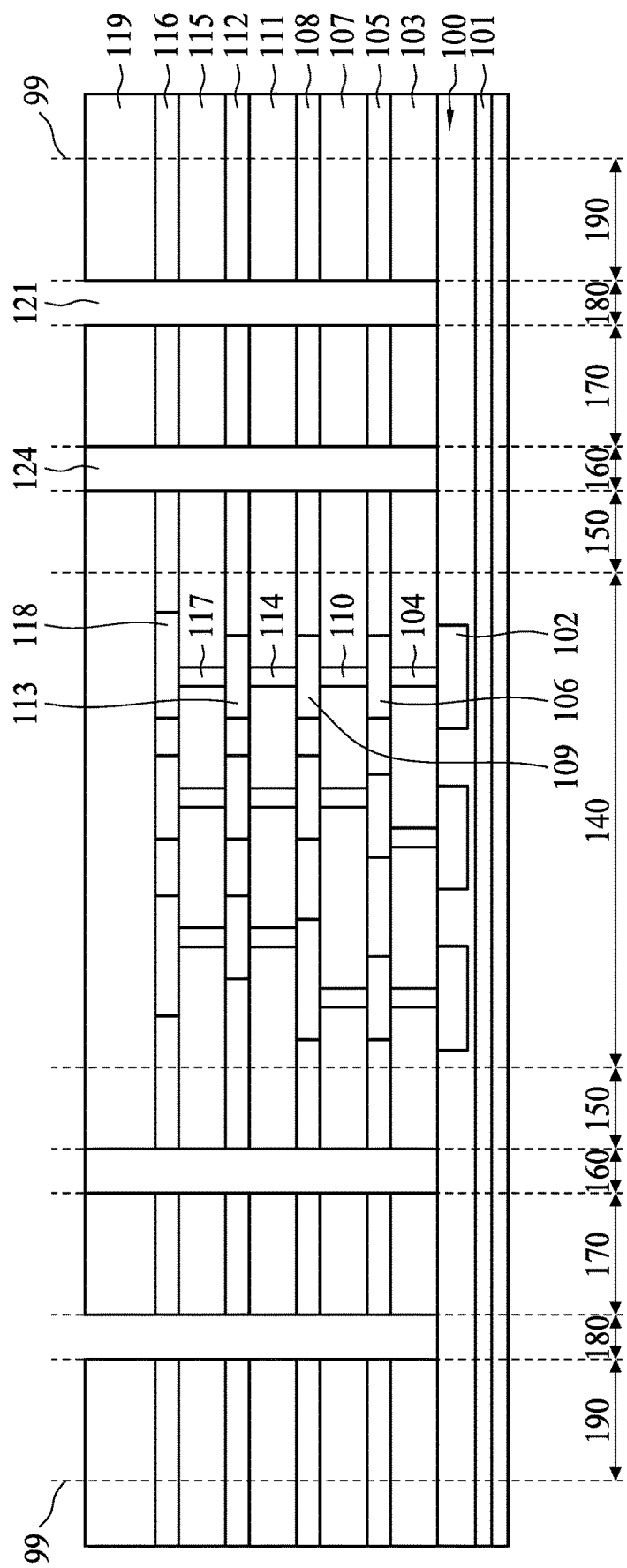

With reference to FIG. 23, a semiconductor device in accordance with another embodiment is provided. In the embodiment depicted, a first columnar blocking structure 124 is disposed in the first recess region 160. A second recess 121 is disposed in the second recess region 180. No conductive structure is disposed in the first seal region 170 or the second seal region 190.

Figure 24:
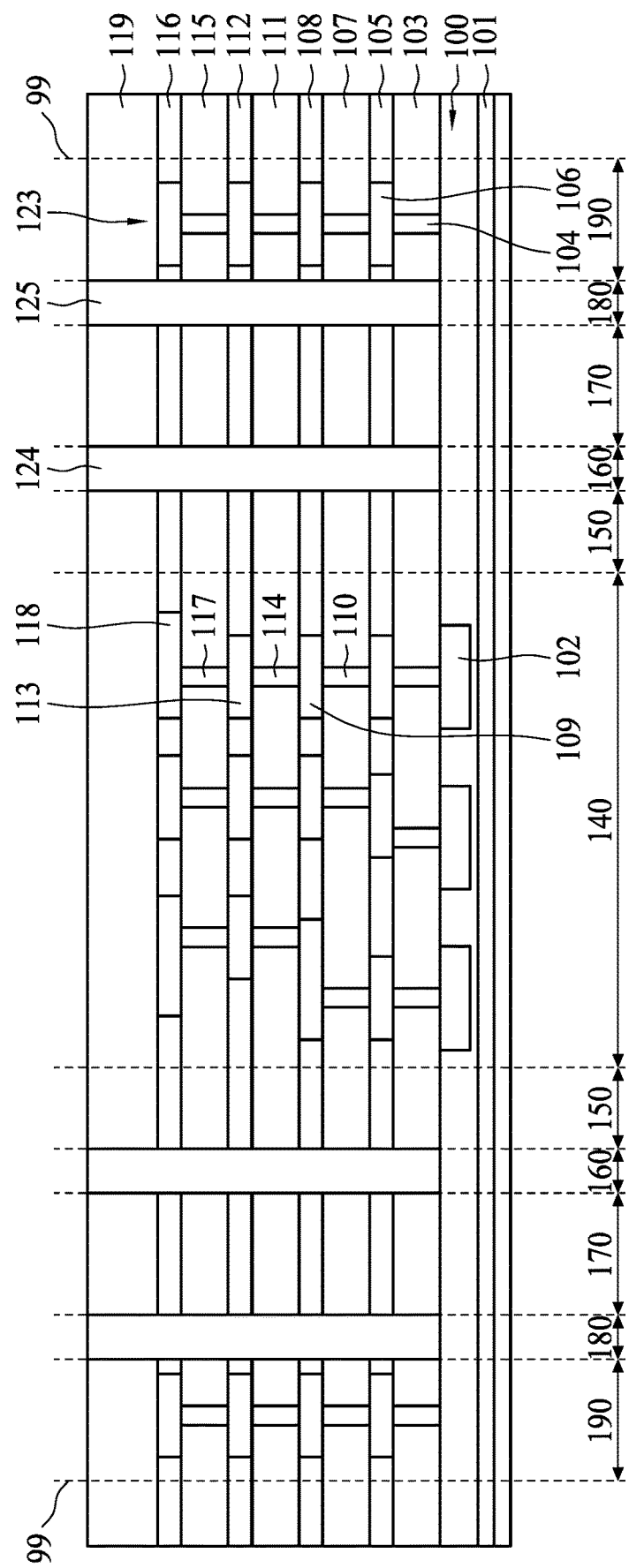

With reference to FIG. 24, a semiconductor device in accordance with another embodiment is provided. In the embodiment depicted, a first columnar blocking structure 124 and a second columnar blocking structure 125 are respectively disposed in the first recess region 160 and the second recess region 180. A second conductive structure 123 is disposed in the second seal region 190. No conductive structure is disposed in the first seal region 170.

Figure 25:
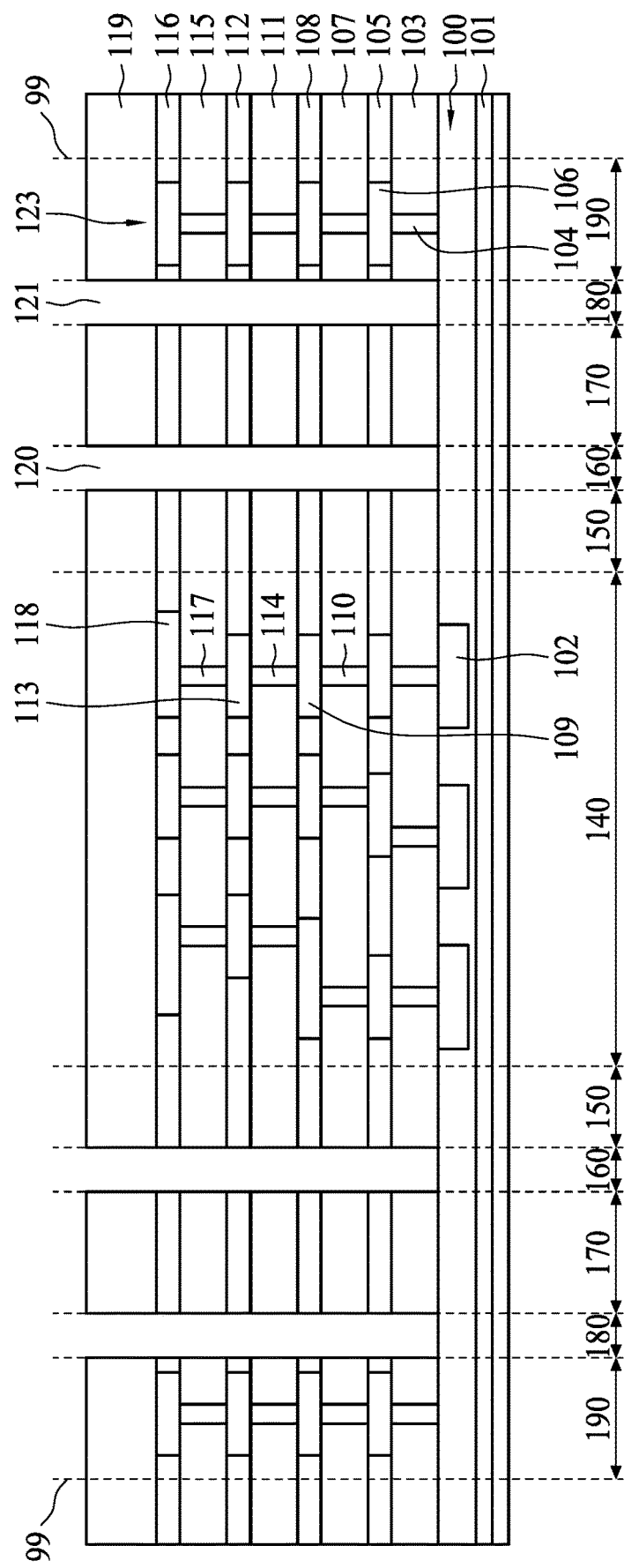

With reference to FIG. 25, a semiconductor device in accordance with another embodiment is provided. In the embodiment depicted, a first recess 120 and a second recess 121 are respectively disposed in the first recess region 160 and the second recess region 180. A second conductive structure 123 is disposed in the second seal region 190. No conductive structure is disposed in the first seal region 170.

Figure 26:
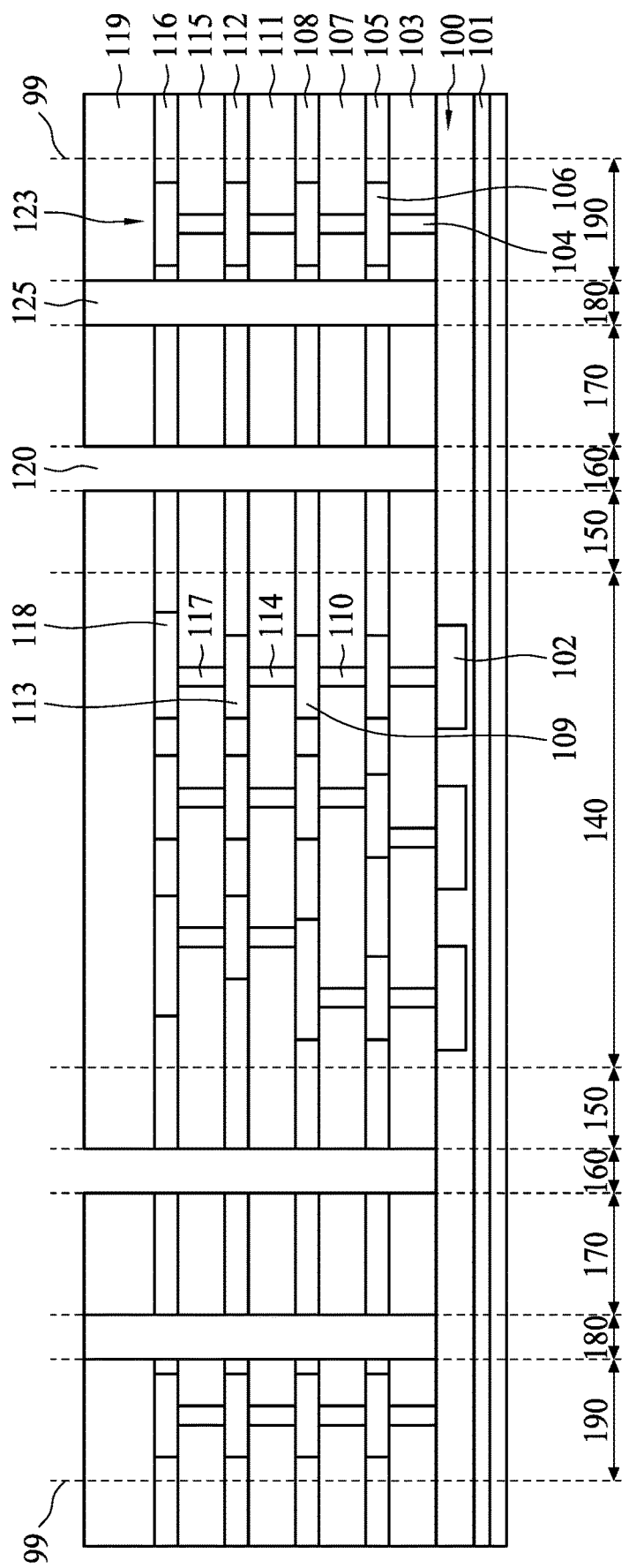

With reference to FIG. 26, a semiconductor device in accordance with another embodiment is provided. In the embodiment depicted, a first recess 120 is disposed in the first recess region 160. A second columnar blocking structure 125 is disposed in the second recess region 180. A second conductive structure 123 is disposed in the second seal region 190. No conductive structure is disposed in the first seal region 170.

Figure 27:
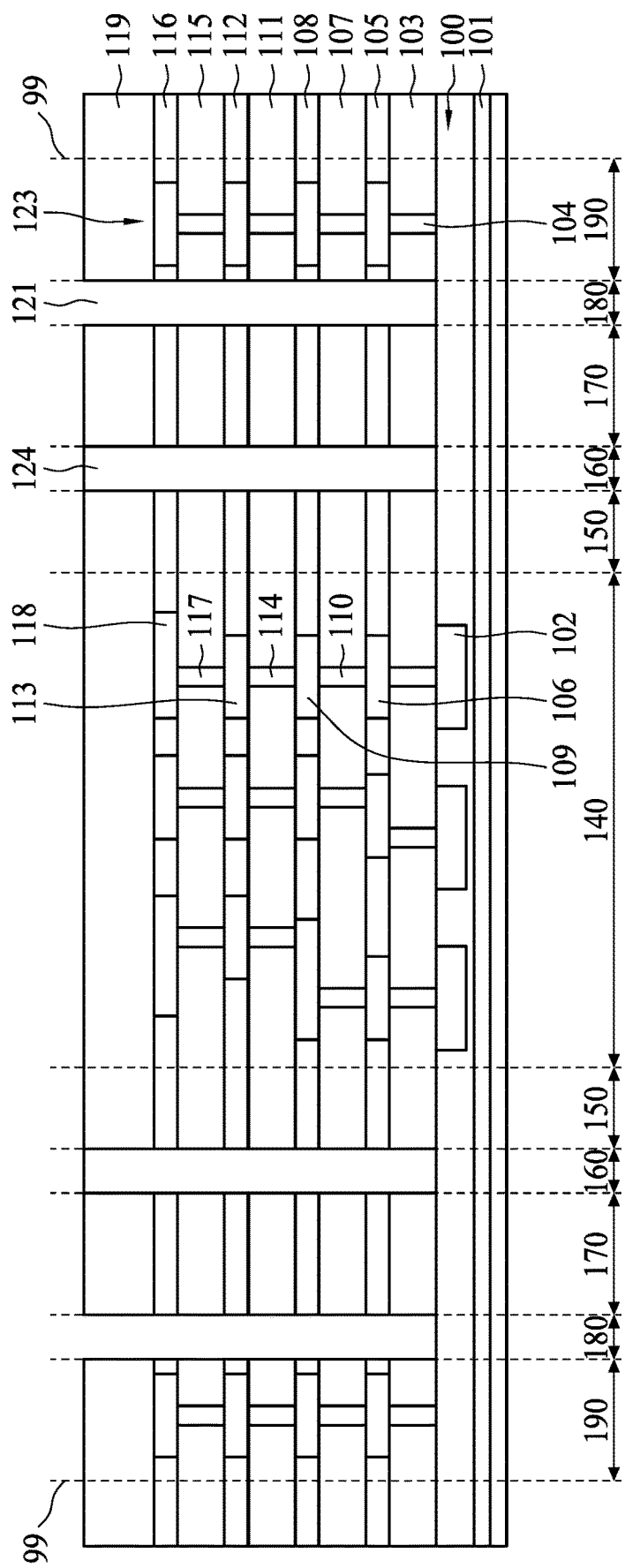

With reference to FIG. 27, a semiconductor device in accordance with another embodiment is provided. In the embodiment depicted, a first columnar blocking structure 124 is disposed in the first recess region 160. A second recess 121 is disposed in the second recess region 180. A second conductive structure 123 is disposed in the second seal region 190. No conductive structure is disposed in the first seal region 170.

Figure 28:
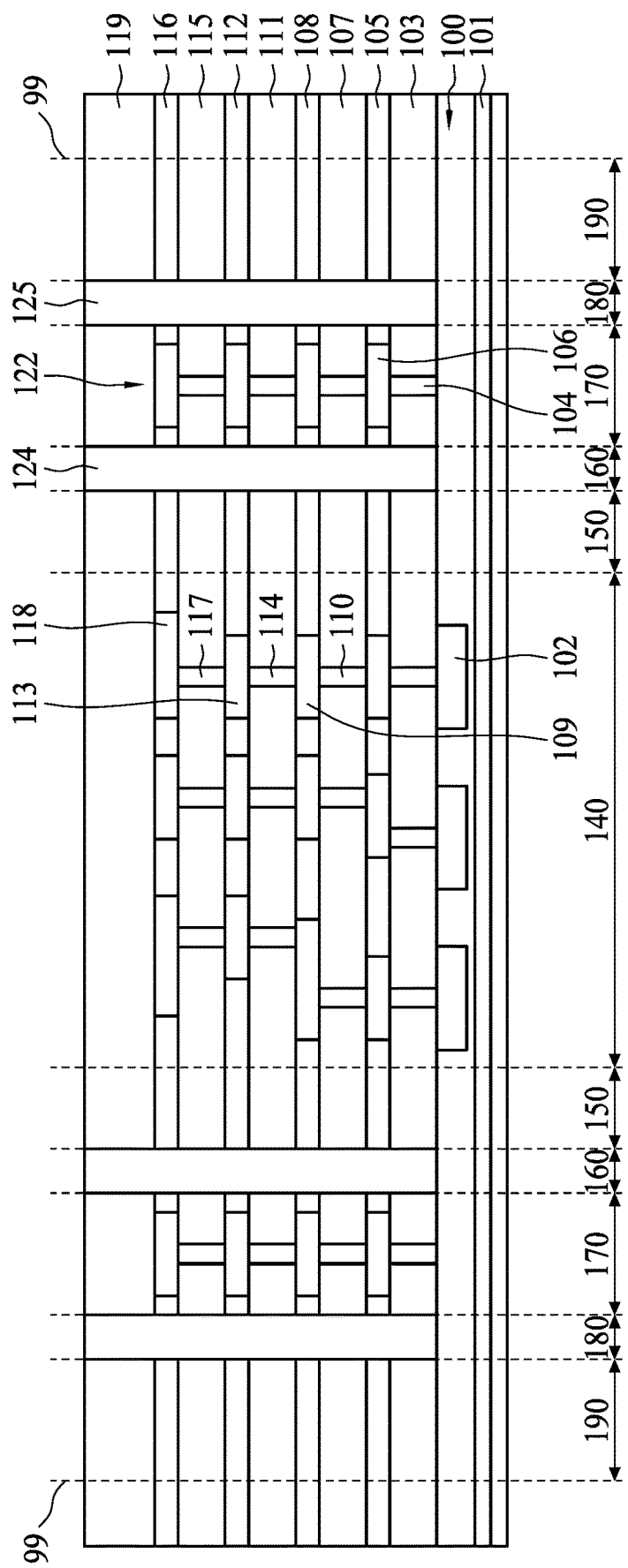

With reference to FIG. 28, a semiconductor device in accordance with another embodiment is provided. In the embodiment depicted, a first columnar blocking structure 124 and a second columnar blocking structure 125 are respectively disposed in the first recess region 160 and the second recess region 180. A first conductive structure 122 is disposed in the first seal region 170. No conductive structure is disposed in the second seal region 190.

Figure 29:
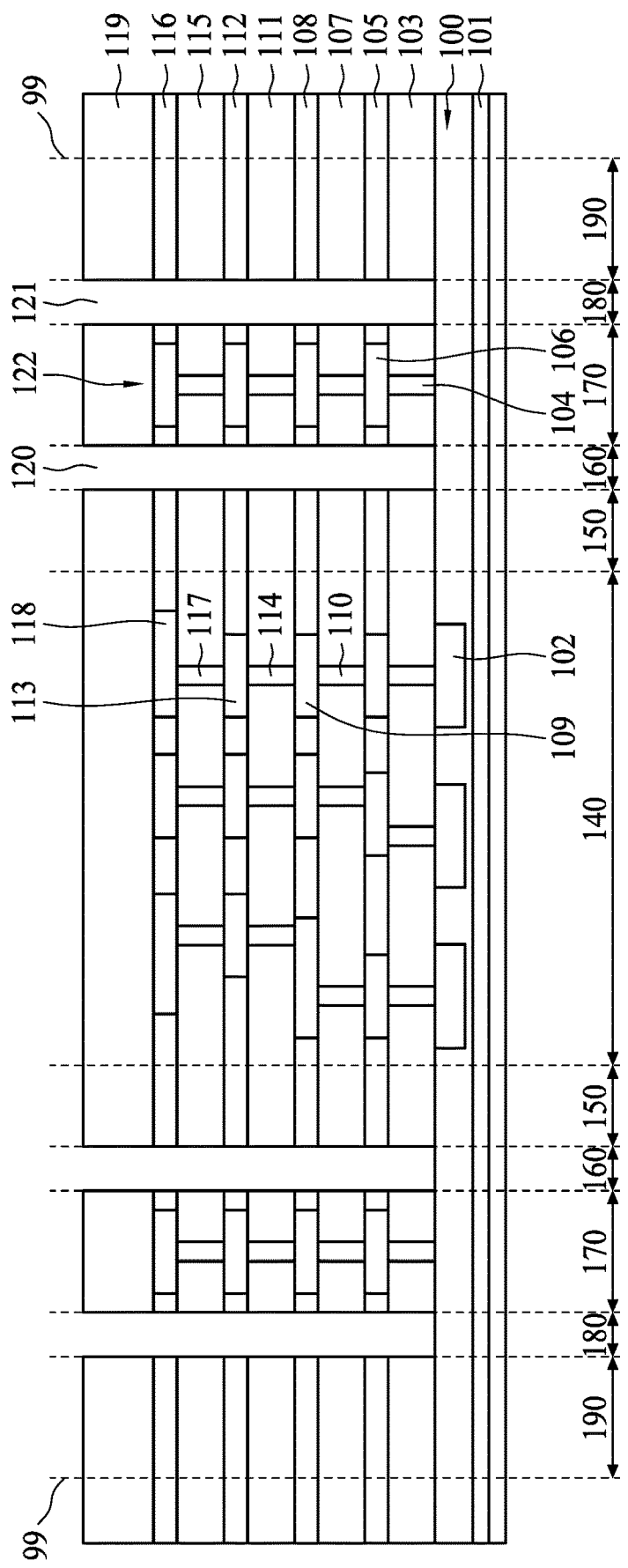

With reference to FIG. 29, a semiconductor device in accordance with another embodiment is provided. In the embodiment depicted, a first recess 120 and a second recess 121 are respectively disposed in the first recess region 160 and the second recess region 180. A first conductive structure 122 is disposed in the first seal region 170. No conductive structure is disposed in the second seal region 190.

Figure 30:
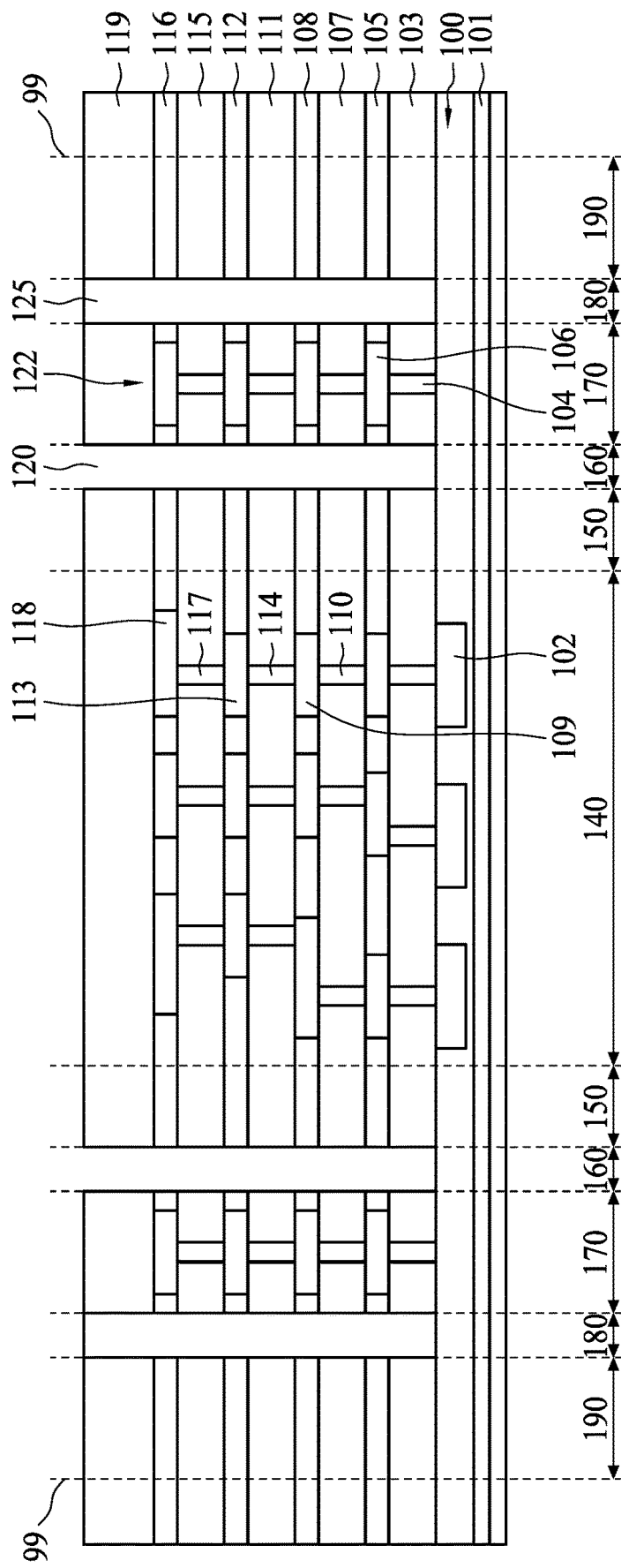

With reference to FIG. 30, a semiconductor device in accordance with another embodiment is provided. In the embodiment depicted, a first recess 120 is disposed in the first recess region 160. A second columnar blocking structure 125 is disposed in the second recess region 180. A first conductive structure 122 is disposed in the first seal region 170. No conductive structure is disposed in the second seal region 190.

Figure 31:
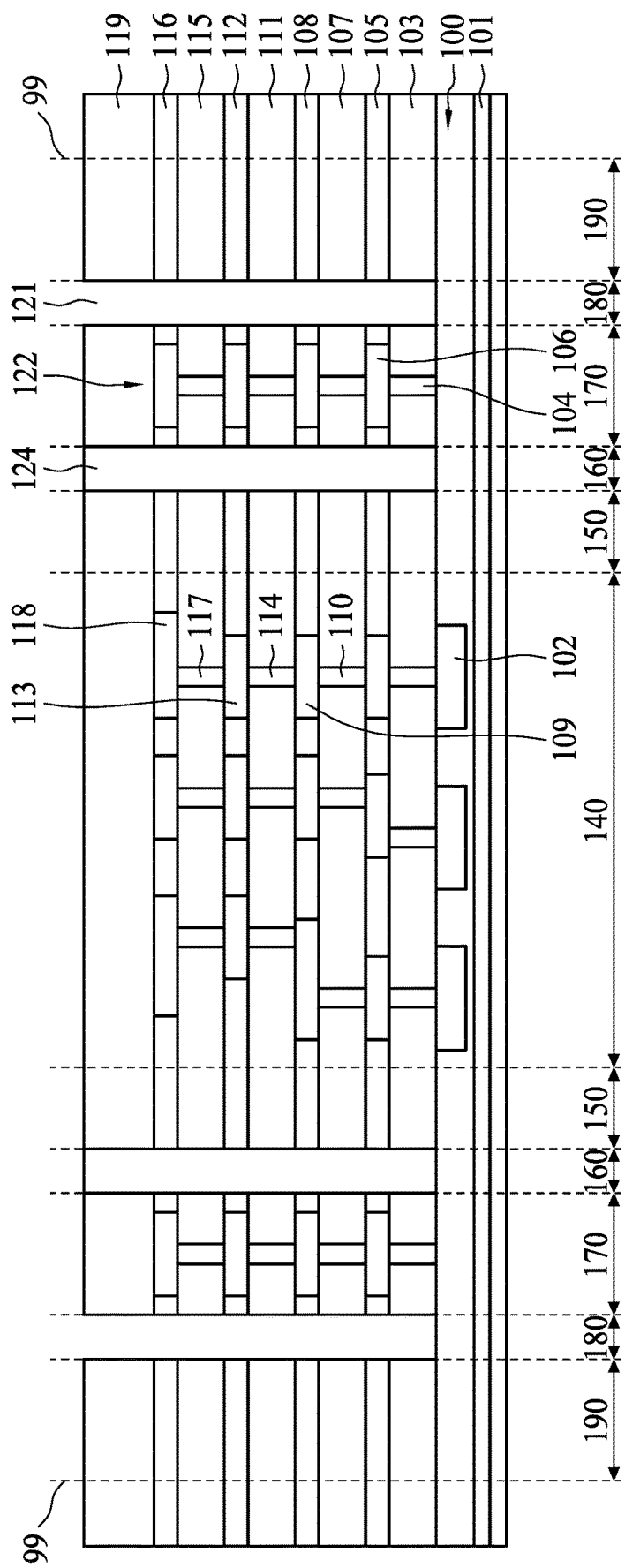

With reference to FIG. 31, a semiconductor device in accordance with another embodiment is provided. In the embodiment depicted, a first columnar blocking structure 124 is disposed in the first recess region 160. A second recess 121 is disposed in the second recess region 180. A first conductive structure 122 is disposed in the first seal region 170. No conductive structure is disposed in the second seal region 190.

Figure 32:
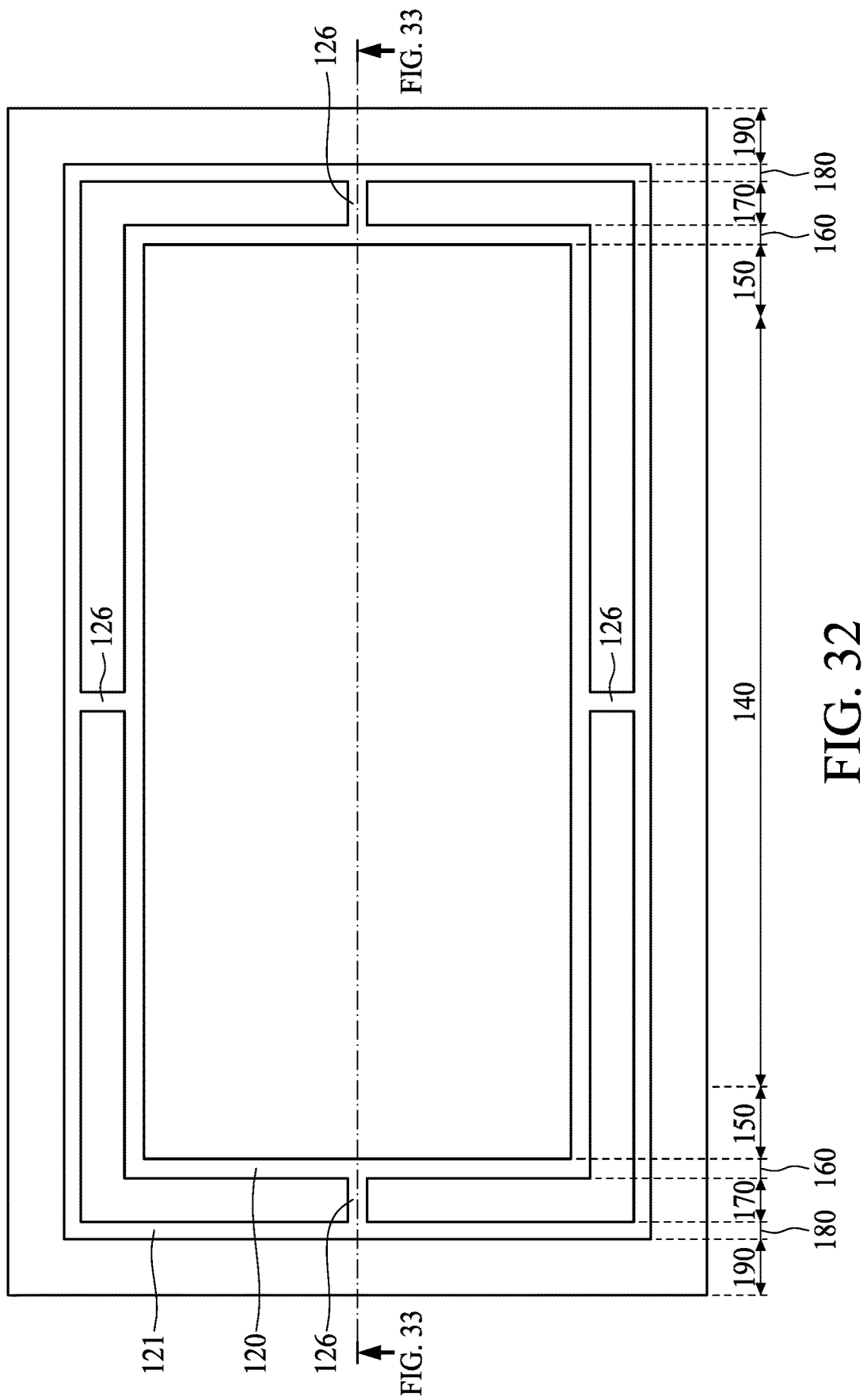
FIG. 32 illustrates, in a schematic top-view diagram, another semiconductor device in accordance with the embodiment shown in FIG. 33.
Figure 33:
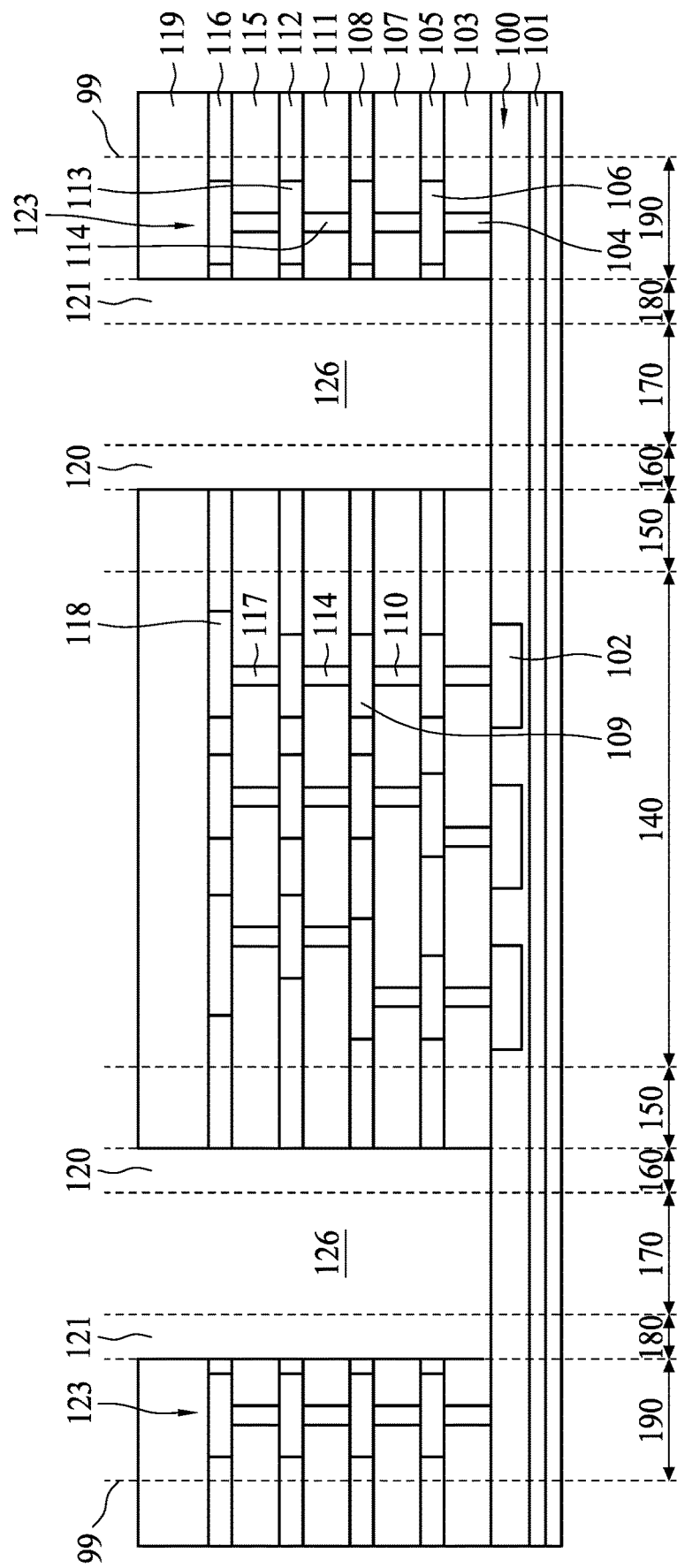

With reference to FIG. 32 and FIG. 33, a semiconductor device in accordance with another embodiment is provided. In the embodiment depicted, at least two third recesses 126 are disposed in the first seal region 170 and connect the first recess 120 to the second recess 121. The at least two third recesses 126 divide the first seal region 170 into at least two sub-regions; that is, the at least two third recesses 126 divide the first conductive structure into at least two sub-units.

The first columnar blocking structure 124 and the second columnar blocking structure 125 are formed of, for example, a conductive material or a dielectric material. The conductive material is, for example, aluminum, copper, tungsten, cobalt, or other suitable metal or metal alloy. The dielectric material is, for example, undoped silicate glass, silicon nitride, silicon-oxy-nitride, barium strontium titanate, lead zirconium titanate, titanium oxide, aluminum oxide, hafnium oxide, or zirconium oxide. The first conductive structure 122 and the second conductive structure 123 are formed of, for example, a conductive material such as aluminum, copper, tungsten, cobalt, or other suitable metal or metal alloy.

The first recess 120 or the second recess 121 of the semiconductor device may stop a crack propagating toward the integrated circuit region 140 or reduce the stress of the crack, especially lateral stress. The first conductive structure 122 or the second conductive structure 123 of the semiconductor device may respectively serve as a wall to protect the integrated circuit region 140 from potential damage due to stress or infiltration by contaminants. The first columnar blocking structure 124 or the second columnar blocking structure 125 may present a barrier in order to prevent moisture from entering from a side. The first passivation layer 119 may improve the mechanical strength of the semiconductor device and prevent moisture from entering from above. With the aforementioned advantageous features, a reliable semiconductor device may be provided.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
  at least one die comprising:
    a substrate;
    a plurality of insulating layers stacked on the substrate;
    an integrated circuit region;
    a first recess region surrounding the integrated circuit region, wherein a first recess is formed at the first recess region and is extended to a top surface of the first recess region, wherein the first recess has a uniform width extended through the insulating layers from the top surface of the first recess region to a top surface of the substrate; and
    a second recess region surrounding the first recess region, wherein a second recess is formed at the second recess region and is extended to a top surface of the second recess region, wherein the second recess has a uniform width extended through the insulating layers from the top surface of the second recess region to the top surface of the substrate;
  wherein a first columnar blocking structure is disposed in the first recess region to surround the integrated circuit region and a second columnar blocking structure is disposed in the second recess region to surround the first columnar blocking structure, wherein the first columnar blocking structure is filled at the first recess from the top surface thereof while the second columnar blocking structure is filled at the second recess from the top surface thereof, such that each of the first columnar blocking structure and the second columnar blocking structure has a uniform width, wherein each of the first columnar blocking structure and the second columnar blocking structure is formed of dielectric material to form a barrier for preventing moisture entering to the integrated circuit region.

2. The semiconductor device of claim 1, further comprising a first conductive structure formed between the first recess and the second recess, wherein the first conductive structure is disposed between the first columnar blocking structure and the second columnar blocking structure, wherein the width of the first recess is equal to the width of the second recess.

3. The semiconductor device of claim 2, further comprising a second conductive structure, wherein the second conductive structure surrounds the second columnar blocking structure, wherein the dielectric material is selected from a group consisting of undoped silicate glass, silicon nitride, silicon-oxy-nitride, barium strontium titanate, lead zirconium titanate, titanium oxide, aluminum oxide, hafnium oxide, and zirconium oxide.

4. The semiconductor device of claim 1, further comprising a buffer region being surrounded by the first columnar blocking structure, wherein the buffer region surrounds the integrated circuit region at a position the buffer region is interposed between the integrated circuit region and the first recess region.

5. The semiconductor device of claim 2, wherein the first conductive structure comprises a plurality of conductive layers disposed among some of the plurality of insulating layers.

6. The semiconductor device of claim 3, wherein the second conductive structure comprises a plurality of conductive layers disposed among some of the plurality of insulating layers.

7. The semiconductor device of claim 2, wherein the first conductive structure comprises a plurality of conductive layers and a plurality of vias, wherein the plurality of conductive layers are disposed among some of the plurality of insulating layers, and the plurality of vias pass through the other of the plurality of insulating layers to electrically connect to the plurality of conductive layers.

8. The semiconductor device of claim 3, wherein the second conductive structure comprises a plurality of conductive layers and a plurality of vias, wherein the plurality of conductive layers are disposed among some of the plurality of insulating layers, and the plurality of vias pass through the other of the plurality of insulating layers to electrically connect to the plurality of conductive layers.

9. The semiconductor device of claim 3, wherein the first conductive structure and the second conductive structure are electrically grounded.

10. A method for fabrication of a semiconductor device, comprising:
  providing a substrate having functional circuits formed therein;
  forming a plurality of insulating layers, wherein the plurality of insulating layers are stacked on the substrate;
  forming a plurality of conductive layers and a plurality of vias, wherein the plurality of conductive layers are disposed among some of the plurality of insulating layers, and the plurality of vias pass through the other of the plurality of insulating layers to electrically connect to the plurality of conductive layers;
  forming a first recess and a second recess, wherein the first recess extends through the plurality of insulating layers and surrounds the functional circuits, and the second recess extends through the plurality of insulating layers and surrounds the first recess, wherein each of the first recess and the second recess is extended to a top surface of the substrate, wherein each of the first recess and the second recess has a uniform width extended to the top surface of the substrate through the insulating layers;
  filling a dielectric material into the each of the first recess and the second recess to form a first columnar blocking structure and a second columnar blocking structure respectively so as to form a barrier for preventing moisture entering to the functional circuits; and
  forming a buffer region, wherein the buffer region surrounds the functional circuits at a position the buffer region is interposed between the functional circuits and the first recess.

* * * * *